(12) United States Patent
Akou

(10) Patent No.: US 11,923,324 B2
(45) Date of Patent: Mar. 5, 2024

(54) SEMICONDUCTOR MEMORY DEVICE

(71) Applicant: Kioxia Corporation, Tokyo (JP)

(72) Inventor: Masayuki Akou, Yokohama (JP)

(73) Assignee: Kioxia Corporation, Tokyo (JP)

(*) Notice: Subject to any disclaimer, the term of this patent is extended or adjusted under 35 U.S.C. 154(b) by 385 days.

(21) Appl. No.: 17/190,479

(22) Filed: Mar. 3, 2021

(65) Prior Publication Data

US 2022/0068850 A1 Mar. 3, 2022

(30) Foreign Application Priority Data

Aug. 25, 2020 (JP) ................. 2020-141836

(51) Int. Cl.
| | | |
|---|---|---|
| H01L 23/00 | (2006.01) | |
| H01L 23/522 | (2006.01) | |
| H10B 41/27 | (2023.01) | |
| H10B 41/41 | (2023.01) | |
| H10B 43/27 | (2023.01) | |
| H10B 43/40 | (2023.01) | |

(52) U.S. Cl.
CPC .......... *H01L 24/05* (2013.01); *H01L 23/5226* (2013.01); *H10B 41/27* (2023.02); *H10B 41/41* (2023.02); *H10B 43/27* (2023.02); *H10B 43/40* (2023.02); *H01L 2224/05025* (2013.01)

(58) Field of Classification Search
CPC ................. H01L 24/05; H01L 23/5226; H01L 2224/05025; H01L 24/48; H01L 24/06; H01L 24/49; H01L 2224/0401; H01L 2224/48145; H10B 41/27; H10B 41/41; H10B 43/27; H10B 43/40; H10B 41/10; H10B 43/10; G11C 5/025; G11C 5/04
See application file for complete search history.

(56) References Cited

U.S. PATENT DOCUMENTS

| | | |
|---|---|---|
| 10,706,931 B2 | 7/2020 | Maejima |
| 2014/0346516 A1 | 11/2014 | Lee et al. |
| 2019/0057973 A1 | 2/2019 | Terada et al. |
| 2019/0287894 A1 | 9/2019 | Nakajima et al. |
| 2020/0091064 A1 | 3/2020 | Iwasaki et al. |
| 2020/0091084 A1 | 3/2020 | Kim et al. |
| 2020/0111810 A1 | 4/2020 | Tagami et al. |
| 2020/0203329 A1* | 6/2020 | Kanamori ............... H01L 24/09 |

FOREIGN PATENT DOCUMENTS

JP 2017-157260 A 9/2017

* cited by examiner

*Primary Examiner* — Julia Slutsker

(74) *Attorney, Agent, or Firm* — Oblon, McClelland, Maier & Neustadt, L.L.P.

(57) ABSTRACT

A semiconductor memory device includes a substrate, a memory cell array separated from the substrate, and a plurality of first bonding pad electrodes away from the memory cell array. The substrate includes a plurality of first and second regions arranged alternately. The memory cell array includes a plurality of conductive layers extending across the plurality of first and second regions, a plurality of semiconductor layers disposed in the plurality of first regions, and a plurality of first contacts disposed in the plurality of second regions. When a distance between a center position of the first bonding pad electrode and a center position of the first contact closest to the first bonding pad electrode is defined as a first distance, a difference between a largest first distance and a smallest first distance among a plurality of first distances is 400 nm or less.

9 Claims, 35 Drawing Sheets

US 11,923,324 B2

SEMICONDUCTOR MEMORY DEVICE

CROSS-REFERENCE TO RELATED APPLICATIONS

This application is based upon and claims the benefit of Japanese Patent Application No. 2020-141836, filed on Aug. 25, 2020, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers stacked in a direction intersecting with a surface of this substrate, and a semiconductor layer opposed to the plurality of conductive layers.

DETAILED DESCRIPTION

Figure 1:
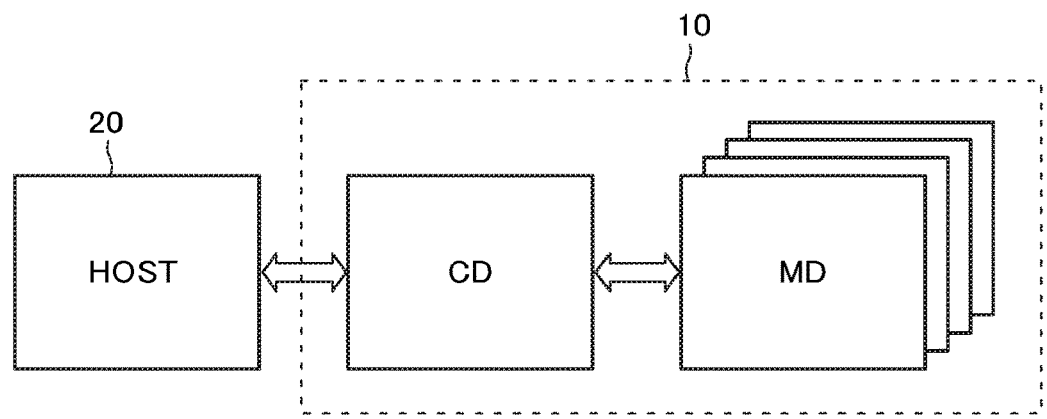
FIG. 1 is a schematic block diagram illustrating a configuration of a memory system 10 according to a first embodiment.

A semiconductor memory device according to one embodiment includes: a substrate; a memory cell array disposed to be separated from the substrate in a first direction intersecting with a surface of the substrate; and a plurality of first bonding pad electrodes arranged in a second direction intersecting with the first direction, the plurality of first bonding pad electrodes being disposed at positions away from the memory cell array in a third direction intersecting with the first direction and the second direction, the plurality of first bonding pad electrodes being usable for an input of data to be written to the memory cell array and an output of data read from the memory cell array. The substrate includes a plurality of first regions and a plurality of second regions arranged alternately in the second direction. The memory cell array includes: a plurality of conductive layers that extend in the second direction across the plurality of first regions and the plurality of second regions, the plurality of conductive layers being arranged in the first direction; a plurality of semiconductor layers disposed in the plurality of first regions, the plurality of semiconductor layers extending in the first direction and being opposed to the plurality of conductive layers; and a plurality of first contacts disposed in the plurality of second regions, the plurality of first contacts extending in the first direction, the plurality of first contacts having one ends in the first direction closer to the substrate than the plurality of conductive layers and other ends in the first direction farther from the substrate than the plurality of conductive layers. When a distance in the second direction and the third direction between a center position in the second direction and the third direction of a first bonding pad electrode of one of the plurality of first bonding pad electrodes and a center position in the second direction and the third direction of a first contact of the plurality of first contacts closest to the first bonding pad electrode is defined as a first distance, a difference between a largest first distance and a smallest first distance among a plurality of first distances corresponding to the plurality of first bonding pad electrodes is 400 nm or less.

A semiconductor memory device according to one embodiment includes: a substrate; a memory cell array disposed to be separated from the substrate in a first direction intersecting with a surface of the substrate; a plurality of first bonding pad electrodes arranged in a second direction intersecting with the first direction, the plurality of first bonding pad electrodes being disposed at positions away from the memory cell array in a third direction intersecting with the first direction and the second direction, the plurality of first bonding pad electrodes being usable for an input of data to be written to the memory cell array and an output of data read from the memory cell array; a plurality of first driving circuits connected to the plurality of first bonding pad electrodes respectively, each of the plurality of first driving circuits including a plurality of transistors connected in parallel between a first bonding pad electrode of the plurality of first bonding pad electrodes and a voltage supply line; and a plurality of second driving circuits connected to the plurality of first bonding pad electrodes respectively, each of the plurality of second driving circuits each including a comparator connected to the first bonding pad electrode. The substrate includes: a plurality of first regions and a plurality of second regions arranged alternately in the second direction; and a plurality of third regions disposed at positions away from the plurality of first regions and the plurality of second regions in the third direction, the plurality of third regions being arranged in the second direction. The memory cell array includes: a plurality of conductive layers that extend in the second direction across the plurality of first regions and the plurality of second regions, the plurality of conductive layers being arranged in the first direction; a plurality of semiconductor layers disposed in the plurality of first regions, the plurality of semiconductor layers extending in the first direction and being opposed to the plurality of conductive layers; and a plurality of first contacts disposed in the plurality of second regions, the plurality of first contacts extending in the first direction, the plurality of first contacts having one ends in the first direction closer to the substrate than the plurality of conductive layers and other ends in the first direction farther from the substrate than the plurality of conductive layers. The plurality of third regions each include a plurality of transistors constituting one of the plurality of first driving circuits and a plurality of transistors constituting one of the plurality of second driving circuits. When a distance in the second direction and the third direction between a center position in the second direction and the third direction of a third region of one of the plurality of third regions and a center position in the second direction and the third direction of a first contact of the plurality of first contacts closest to the third region is defined as a first distance, a difference between a largest first distance and a smallest first distance among a plurality of first distances corresponding to the plurality of third regions is 400 nm or less.

Next, semiconductor memory devices according to embodiments are described in detail with reference to the accompanying drawings. The following embodiments are only examples, and are not described for the purpose of limiting the present invention. The following drawings are schematic, and for sake of convenience, apart of a configuration and the like is sometimes omitted. Parts common in a plurality of embodiments are attached by same reference numerals and their descriptions may be omitted.

In this specification, when referring to "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to "control circuit", it may mean a peripheral circuit, such as a sequencer, disposed in a memory die, it may mean a controller die, a controller chip, or the like connected to a memory die, or it may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, when referring to a "width", a "length", or a "thickness" in a direction of a configuration, a member, or the like, or a "distance" or the like between configurations or members, this may mean a width, a length, or a thickness in a cross-sectional surface or the like, or a distance or the like observed with a Scanning electron microscopy (SEM), a Transmission electron microscopy (TEM), or the like.

[First Embodiment]

[Memory System 10]

FIG. 1 is a schematic block diagram illustrating a configuration of the memory system 10 according to the first embodiment.

The memory system 10, for example, reads, writes, and erases user data according to a signal transmitted from a host computer 20. The memory system 10 is, for example, any system that can store the user data including a memory chip, a memory card, and an SSD. The memory system 10 includes a plurality of memory dies MD that store the user data and a controller die CD connected to the plurality of memory dies MD and the host computer 20. The controller die CD includes, for example, a processor, a RAM, and the like, and performs conversion between a logical address and a physical address, bit error detection/correction, a garbage collection (compaction), a wear leveling, and the like.

Figure 2:
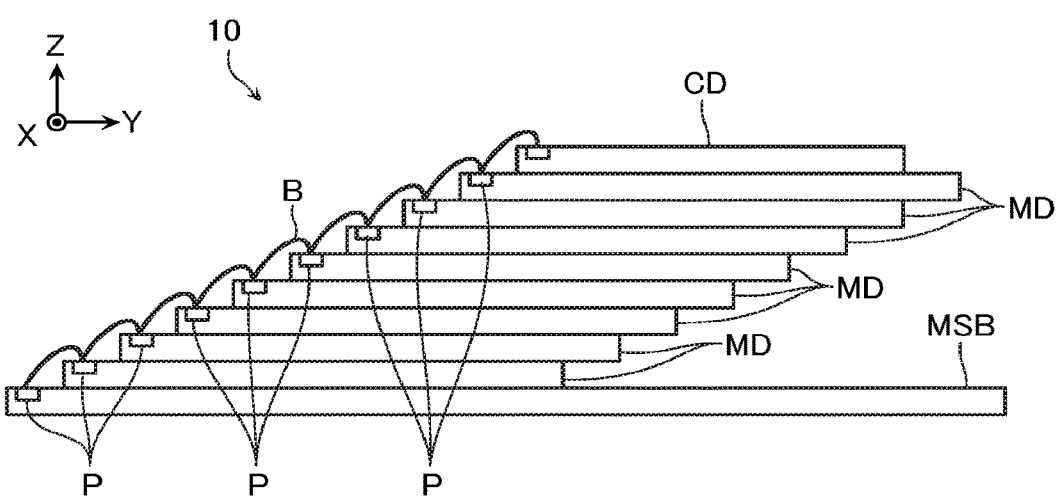
FIG. 2 is a schematic side view illustrating a configuration example of the memory system 10.
Figure 3:
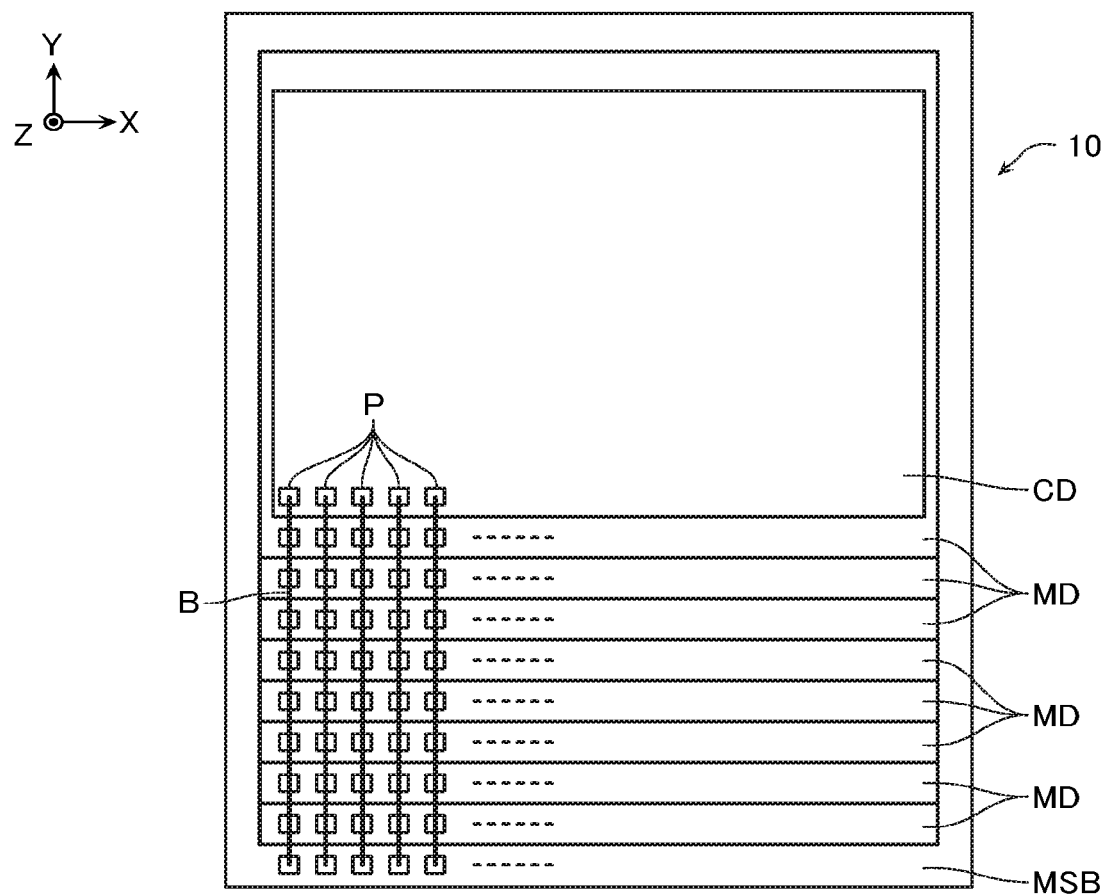
FIG. 3 is a schematic plan view illustrating the configuration example.

FIG. 2 is a schematic side view illustrating a configuration example of the memory system 10 according to the embodiment. FIG. 3 is a schematic plan view illustrating the configuration example. For sake of convenience, FIG. 2 and FIG. 3 omit a part of a configuration.

As illustrated in FIG. 2, the memory system 10 according to the embodiment includes a mounting substrate MSB, the plurality of memory dies MD stacked on the mounting substrate MSB, and the controller die CD stacked on the memory die MD. On an upper surface of the mounting substrate MSB, a pad electrode P is disposed in a region at an end portion in the Y-direction, and a part of the other region is bonded to a lower surface of the memory die MD via an adhesive and the like. On an upper surface of the memory die MD, the pad electrode P is disposed in a region at an end portion in the Y-direction, and the other region is bonded to a lower surface of another memory die MD or the controller die CD via the adhesive and the like. On an upper surface of the controller die CD, the pad electrode P is disposed in a region at an end portion in the Y-direction.

As illustrated in FIG. 3, the mounting substrate MSB, the plurality of memory dies MD, and the controller die CD each include a plurality of the pad electrodes P arranged in the X-direction. The plurality of pad electrodes P disposed to each of the mounting substrate MSB, the plurality of memory dies MD, and the controller die CD are mutually connected via bonding wires B.

Note that the configurations illustrated in FIG. 2 and FIG. 3 are merely examples, and specific configurations are appropriately adjustable. For example, in the example illustrated in FIG. 2 and FIG. 3, the controller die CD is stacked on the plurality of memory dies MD, and these configurations are connected with the bonding wires B. In such a configuration, the plurality of memory dies MD and the controller die CD are included in one package. However, the controller die CD may be included in a package different from the memory die MD.

[Circuit Configuration of Memory Die MD]

Figure 4:
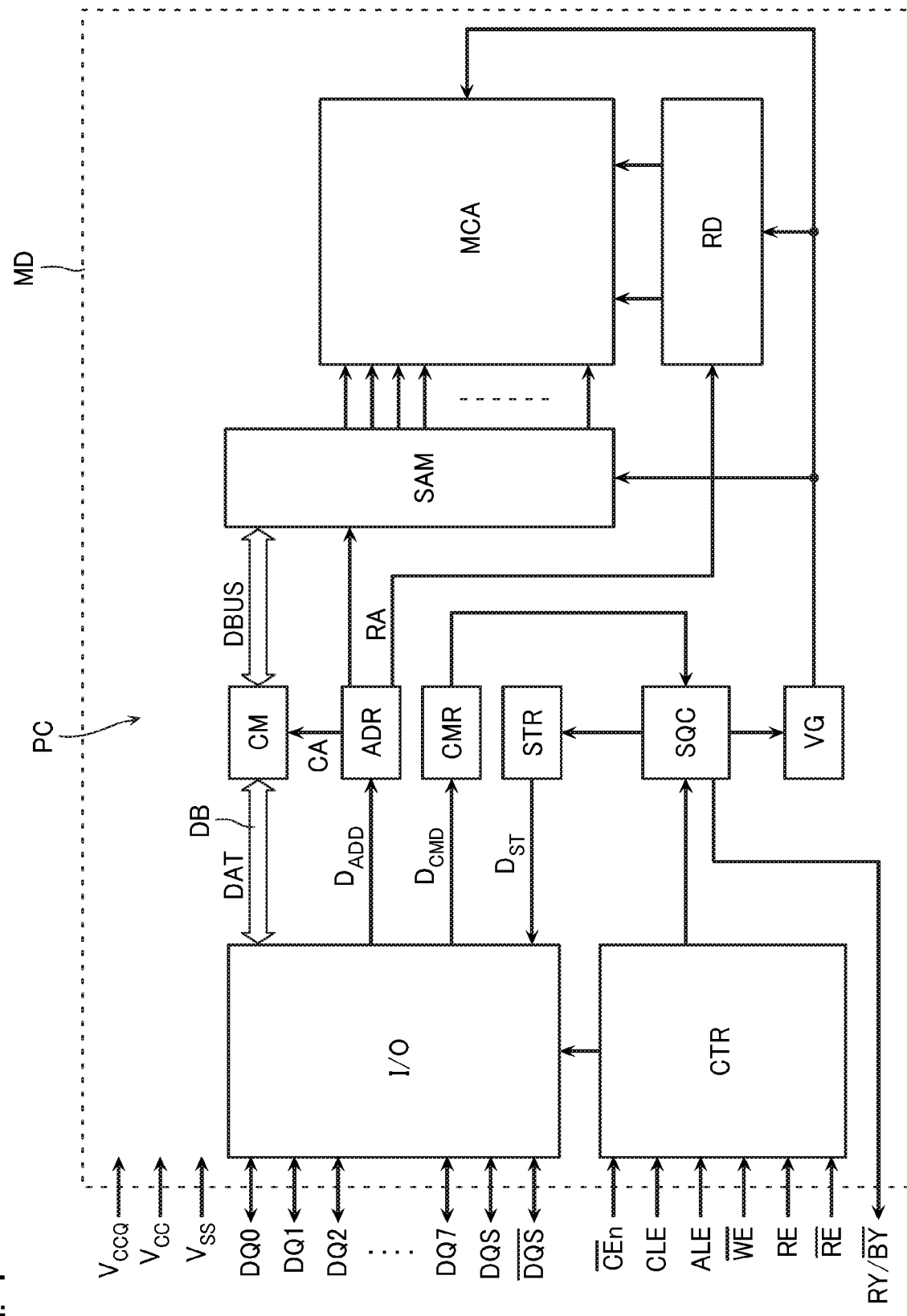
FIG. 4 is a schematic block diagram illustrating a configuration of a memory die MD according to the first embodiment.

FIG. 4 is a schematic block diagram illustrating a configuration of the memory die MD according to the first embodiment. FIG. 5 to FIG. 8 are schematic circuit diagrams illustrating a configuration of a part of the memory die MD.

FIG. 4 illustrates a plurality of control terminals and the like. There may be cases where the plurality of control terminals are expressed as control terminals corresponding to active-high signals (positive logic signals), expressed as control terminals corresponding to active-low signals (negative logic signals), expressed as control terminals corresponding to both of the active-high signals and the active-low signals. In FIG. 4, the reference numeral of the control terminal corresponding to the active-low signal includes an overline (upper line). In this specification, the reference numeral of the control terminal corresponding to the active-low signal includes a slash ("/"). Note that the description in FIG. 4 is an example, and the specific aspect is appropriately adjustable. For example, a part of or all of the active-high signals can be the active-low signals, or a part of or all of the active-low signals can be the active-high signals.

As illustrated in FIG. 4, the memory die MD includes a memory cell array MCA that stores data and a peripheral circuit PC connected to the memory cell array MCA. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

Figure 5:
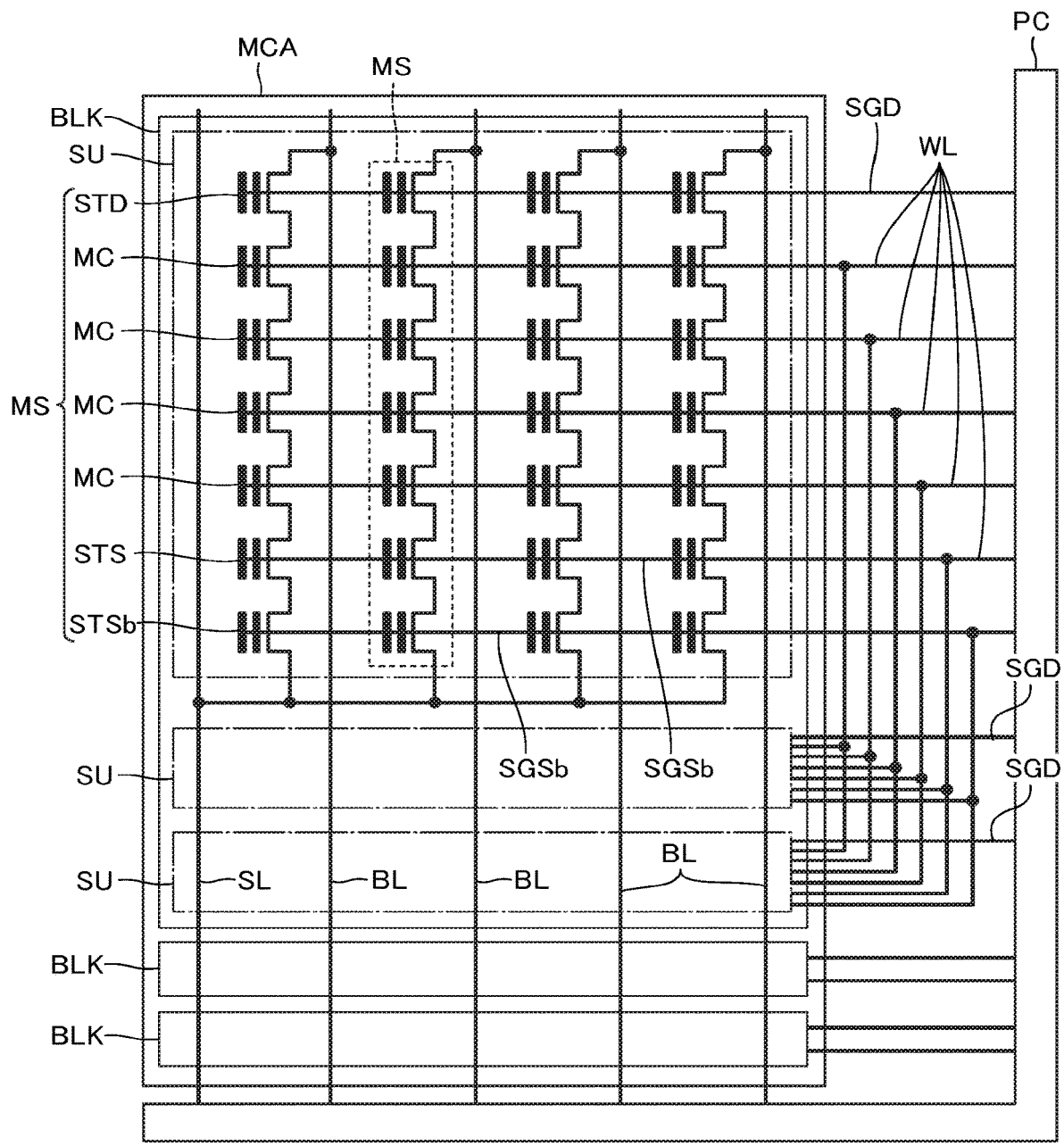
FIG. 5 is a schematic circuit diagram illustrating a configuration of a part of the memory die MD.

The memory cell array MCA includes a plurality of memory blocks BLK as illustrated in FIG. 5. The plurality of memory blocks BLK each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores one bit or a plurality of bits of data. Word lines WL are connected to respective gate electrodes of the plurality of memory cells MC corresponding to one memory string MS. These respective word lines WL are connected to all of the memory strings MS in one memory block BLK in common.

The select transistor (STD, STS, STSb) is a field-effect type transistor including a semiconductor layer that functions as a channel region, a gate insulating film, and a gate electrode. The select gate lines (SGD, SGS, SGSb) are connected to the respective gate electrodes of the select transistors (STD, STS, STSb). The drain-side select gate line SGD is disposed corresponding to the string unit SU and connected to all of the memory strings MS in one string unit SU in common. The source-side select gate line SGSb is connected to all of the memory strings MS in the plurality of string units SU in common. The source-side select gate line SGSb is connected to all of the memory strings MS in the plurality of string units SU in common.

The voltage generation circuit VG (FIG. 4) includes, for example, a step down circuit, such as a regulator, and a step up circuit, such as a charge pump circuit. These step down circuit and step up circuit are each connected to a voltage supply line to which a power supply voltage $V_{CC}$ and a ground voltage $V_{SS}$ are supplied. These voltage supply lines are connected to, for example, the pad electrodes P described with reference to FIG. 2 and FIG. 3. For example, the voltage generation circuit VG generates a plurality of patterns of operating voltages applied to the bit line BL, the source line SL, the word line WL, and the select gate line (SGD, SGS, SGSb) in a read operation, a write operation, and an erase operation on the memory cell array MCA, in accordance with a control signal from the sequencer SQC to simultaneously output the operating voltages to the plurality of voltage supply lines. The operating voltage output from the voltage supply line is appropriately adjusted in accordance with the control signal from the sequencer SQC.

The row decoder RD includes, for example, an address decoder that decodes address data ADD and a switch circuit that electrically conducts the word line in the memory cell array MCA to the voltage supply line as necessary in accordance with the output signal of the address decoder.

The sense amplifier module SAM includes, for example, a plurality of sense amplifier units corresponding to the plurality of bit lines BL. The sense amplifier units each include a sense amplifier connected to the bit line BL. The sense amplifier includes a sense circuit connected to the bit line BL, a voltage transfer circuit connected to the bit line BL, and a latch circuit connected to the sense circuit and the voltage transfer circuit. The sense circuit includes a sense transistor that enters an ON state according to the voltage or the current of the bit line BL, and a wiring charged or discharged according to the ON/OFF state of the sense transistor. The latch circuit latches data of "1" or "0" according to the voltage of this wiring. The voltage transfer circuit electrically conducts the bit line BL with any of two voltage supply lines according to the data latched by this latch circuit.

The cache memory CM includes a plurality of latch circuits connected to the latch circuit in the sense amplifier module SAM via a wiring DBUS. Data DAT included in the plurality of latch circuits are sequentially transferred to the sense amplifier module SAM or the input/output control circuit I/O. To the cache memory CM, a decode circuit and a switch circuit (not illustrated) are connected. The decode circuit decodes a column address CA held in the address register ADR (FIG. 4). The switch circuit electrically conducts the latch circuit corresponding to the column address CA with a bus DB (FIG. 4) according to an output signal of the decode circuit.

In accordance with command data $D_{CMD}$ held in the command register CMR, the sequencer SQC (FIG. 4) outputs an internal control signal to the row decoder RD, the sense amplifier module SAM, and the voltage generation circuit VG. The sequencer SQC outputs status data $D_{ST}$ indicating its own state to the status register STR as necessary.

The sequencer SQC generates a ready/busy signal and outputs the ready/busy signal to a terminal RY//BY. During a period in which the terminal RY//BY is in the "L" state, access to the memory die MD is basically inhibited. During a period in which the terminal RY//BY is in the "H" state, access to the memory die MD is permitted. The terminal RY//BY is achieved by, for example, the pad electrode P described with reference to FIG. 2 and FIG. 3.

The input/output control circuit I/O includes data signal input/output terminals DQ0 to DQ7, data strobe signal input/output terminals DQS, /DQS, an input circuit, such as a comparator, and an output circuit, such as an OCD circuit, connected to the data signal input/output terminals DQ0 to DQ7. The input/output control circuit I/O includes a shift register connected to these input circuit and output circuit, and a buffer circuit. The data signal input/output terminals DQ0 to DQ7 and the data strobe signal input/output terminals DQS, /DQS are achieved by, for example, the pad electrodes P described with reference to FIG. 2 and FIG. 3. Data input via the data signal input/output terminals DQ0 to DQ7 are output from the buffer circuit to the cache memory CM, the address register ADR, or the command register CMR according to an internal control signal from the logic circuit CTR. Data output via the data signal input/output terminals DQ0 to DQ7 are input to the buffer circuit from the cache memory CM or the status register STR according to the internal control signal from the logic circuit CTR.

The logic circuit CTR receives an external control signal from the controller die CD via external control terminals /CEn, CLE, ALE, /WE, RE, /RE and outputs the internal control signal to the input/output control circuit I/O according to the external control signal. The external control terminals /CEn, CLE, ALE, /WE, RE, /RE are achieved by, for example, the pad electrodes P described with reference to FIG. 2 and FIG. 3.

Figure 6:
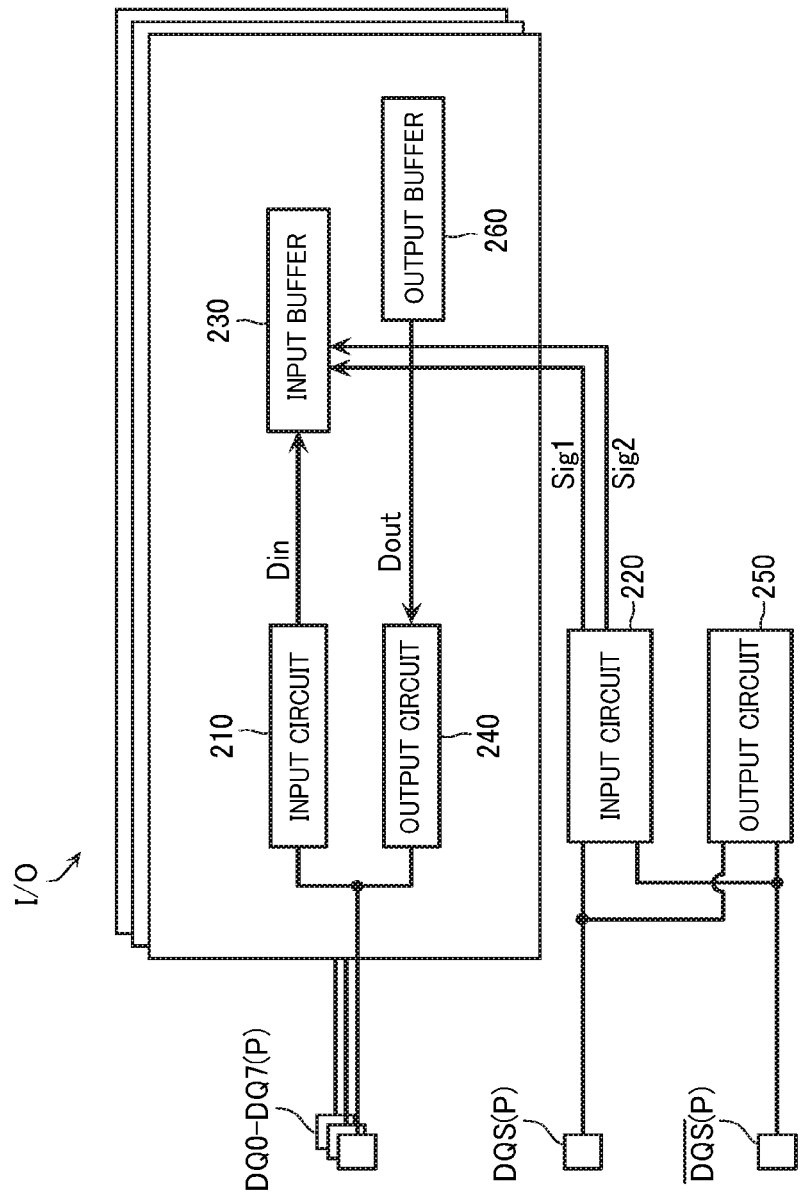
FIG. 6 is a schematic circuit diagram illustrating a configuration of a part of the memory die MD.
Figure 7:
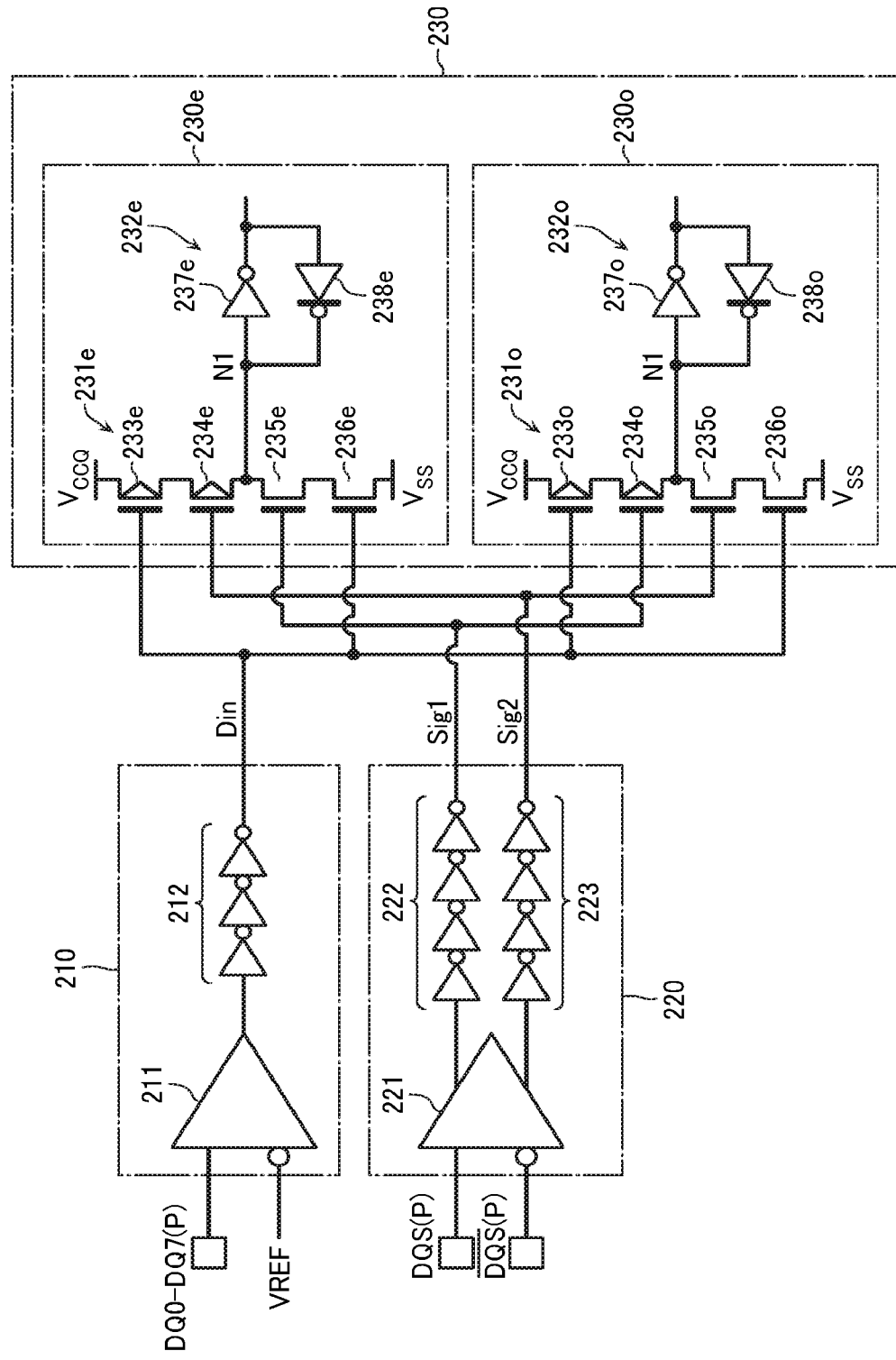
FIG. 7 is a schematic circuit diagram illustrating a configuration of a part of the memory die MD.
Figure 8:
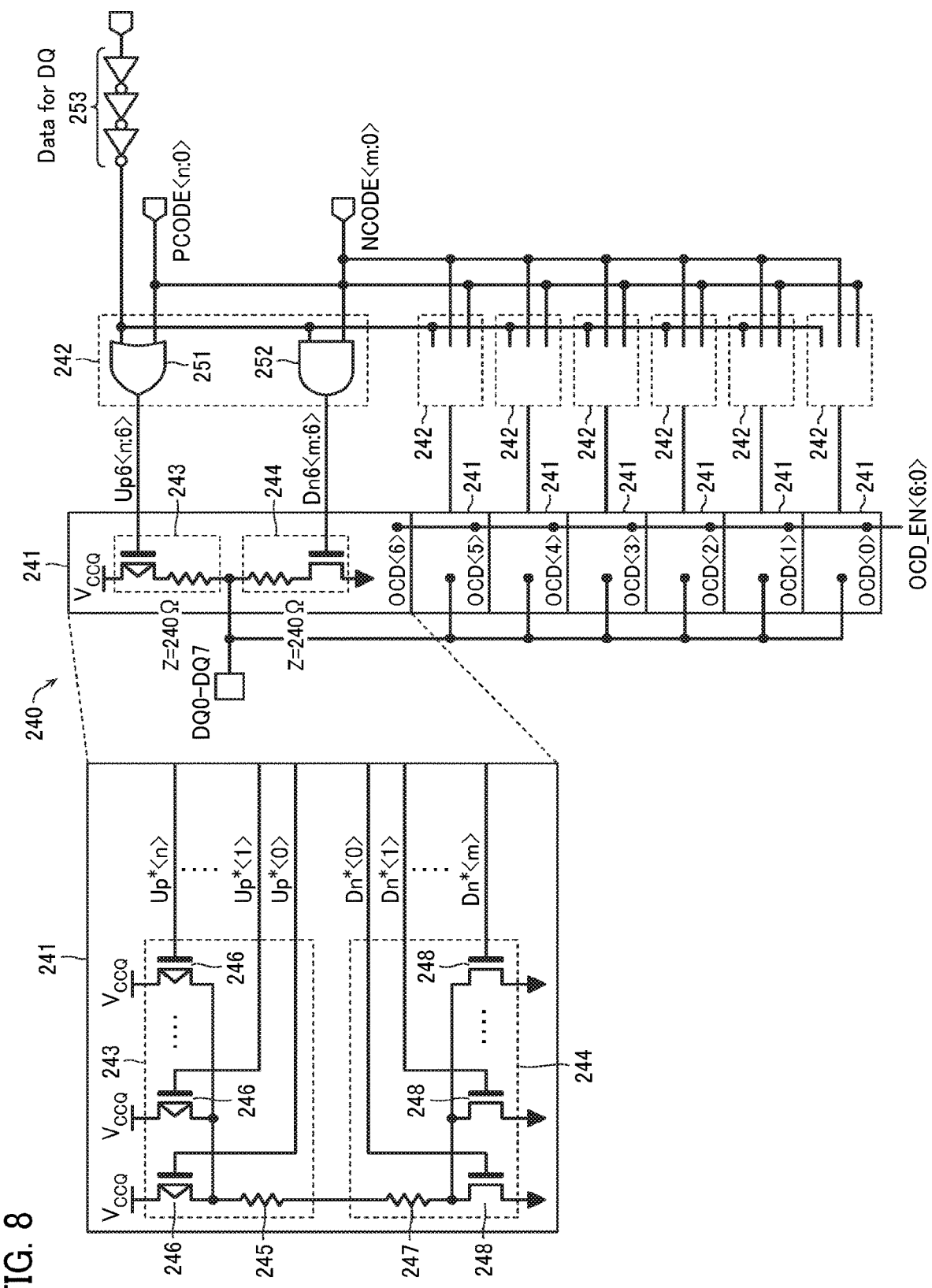
FIG. 8 is a schematic circuit diagram illustrating a configuration of a part of the memory die MD.

FIG. 6 is a schematic block diagram illustrating a configuration of apart of the input/output control circuit I/O. FIG. 7 and FIG. 8 are schematic circuit diagrams illustrating a configuration of a part of the input/output control circuit I/O.

For example, as illustrated in FIG. 6, the input/output control circuit I/O includes a plurality of input circuits 210 connected to the data signal input/output terminals DQ0 to DQ7, an input circuit 220 connected to the data strobe signal input/output terminals DQS, /DQS, and an input buffer circuit 230 connected to the input circuits 210, 220. As "second driving circuit", the input circuit 210, the input circuit 220, and the input buffer circuit 230 may be included. The "second driving circuit" may be only the input circuit 210, may be only the input circuit 220, or may be only the input buffer circuit 230.

For example, as illustrated in FIG. 7, the input circuits 210 include comparators 211 connected to the data signal input/output terminals DQ0 to DQ7 and signal propagation circuits 212 that propagate the output signals of the comparators 211. The comparator 211 has one input terminal connected to any of the data signal input/output terminals DQ0 to DQ7, and the other input terminal connected to a voltage supply line that supplies a reference voltage VREF. The signal propagation circuit 212 propagates the output signal of the comparator 211. A signal Din propagated by the signal propagation circuit 212 is a signal corresponding to the data and the like input via the data signal input/output terminals DQ0 to DQ7.

For example, as illustrated in FIG. 7, the input circuit 220 includes a comparator 221 connected to the data strobe signal input/output terminals DQS, /DQS, and signal propagation circuits 222, 223 that propagate the output signal of the comparator 221. The comparator 221 has one input terminal connected to the data strobe signal input/output terminal DQS, and the other input terminal connected to the data strobe signal input/output terminal /DQS. The signal propagation circuits 222, 223 propagate the output signal of the comparator 221. Signals Sig1, Sig2 propagated by the signal propagation circuits 222, 223 are data strobe signals input via the data strobe signal input/output terminals DQS, /DQS. That is, the signals Sig1, Sig2 are timing control signals that control a timing of retrieving data and also function as so-called clock signals. The signal Sig2 is an inverted signal of the signal Sig1.

For example, as illustrated in FIG. 7, the input buffer circuit 230 includes a circuit element 230e that latches even-numbered data and a circuit element 230o that latches odd-numbered data.

The circuit element 230e includes a clocked inverter 231e and a latch circuit 232e. The clocked inverter 231e includes PMOS transistors 233e, 234e and NMOS transistors 235e, 236e. The PMOS transistors 233e, 234e are connected in series between a voltage supply line that supplies a voltage $V_{CCQ}$ and an output terminal N1. The NMOS transistors 235e, 236e are connected in series between the output terminal N1 and a voltage supply line that supplies the ground voltage $V_{SS}$. The PMOS transistor 233e has a gate electrode connected to an output terminal of the signal propagation circuit 212. The PMOS transistor 234e has a gate electrode connected to an output terminal of the signal propagation circuit 223. The NMOS transistor 235e has a gate electrode connected to an output terminal of the signal propagation circuit 222. The NMOS transistor 236e has a gate electrode connected to the output terminal of the signal propagation circuit 212. The latch circuit 232e includes inverters 237e, 238e. An input terminal of the inverter 237e and an output terminal of the inverter 238e are connected to the output terminal N1 of the clocked inverter 231e. An output terminal of the inverter 237e and an input terminal of the inverter 238e are connected to a circuit (not illustrated), such as a FIFO buffer.

The circuit element 230o includes a clocked inverter 231o and a latch circuit 232o. The clocked inverter 231o includes PMOS transistors 233o, 234o and NMOS transistors 235o, 236o. The PMOS transistors 233o, 234o are connected in series between the voltage supply line that supplies the voltage $V_{CCQ}$ and the output terminal N1. The NMOS transistors 235o, 236o are connected in series between the output terminal N1 and the voltage supply line that supplies the ground voltage $V_{ss}$. The PMOS transistor 233o has a gate electrode connected to the output terminal of the signal propagation circuit 212. The PMOS transistor 234o has a gate electrode connected to the output terminal of the signal propagation circuit 222. The NMOS transistor 235o has a gate electrode connected to the output terminal of the signal propagation circuit 223. The NMOS transistor 236o has a gate electrode connected to the output terminal of the signal propagation circuit 212. The latch circuit 232o includes inverters 237o, 238o. An input terminal of the inverter 237o and an output terminal of the inverter 238o are connected to the output terminal N1 of the clocked inverter 231o. An output terminal of the inverter 237o and an input terminal of the inverter 238o are connected to a circuit (not illustrated), such as a FIFO buffer.

For example, as illustrated in FIG. 6, the input/output control circuit I/O includes a plurality of output circuits 240 connected to the data signal input/output terminals DQ0 to DQ7, a plurality of output circuits 250 connected to the data strobe signal input/output terminals DQS, /DQS, and an output buffer circuit 260 connected to the output circuits 240. As "first driving circuits", an output circuit 250 and the output buffer circuit 260 may be included. The "first driving circuit" may be only the output circuit 250 or may be only the output buffer circuit 260.

For example, as illustrated in FIG. 8, the output circuit 240 includes seven OCD units 241 connected to the respective data signal input/output terminals DQ0 to DQ7 in parallel, and seven OCD unit control circuits 242 connected to the seven OCD units 241.

The seven OCD units 241 each have, for example, an impedance of 240Ω. The seven OCD units 241 are each connected to a signal line OCD_EN<6:0>, and the number of the OCD units 241 to be driven is controlled according to the signal line OCD_EN<6:0>. For example, when a signal 0000001 (01 in hexadecimal) is input to the signal line OCD_EN<6:0>, one OCD unit 241 is driven to set an impedance $Z_{DRV}$ of the output circuit 240 to approximately 240Ω. For example, when a signal 0011111 (1F in hexadecimal) is input to the signal line OCD_EN<6:0>, the five OCD units 241 are driven to set the impedance $Z_{DRV}$ of the output circuit 240 to approximately 240Ω/5=48Ω. The signal of the signal line OCD_EN<6:0> is controlled by, for example, a user.

The OCD units 241 each include a pull-up circuit 243 connected between the voltage supply line that supplies the voltage $V_{CCQ}$ and any of the data signal input/output terminals DQ0 to DQ7. The OCD units 241 each include a pull-down circuit 244 connected between any of the data signal input/output terminals DQ0 to DQ7 and the voltage supply line that supplies the ground voltage $V_{SS}$.

The pull-up circuit 243 includes a resistive element 245 connected to the data signal input/output terminals DQ0 to DQ7, and n+1 (n is a natural number) transistors 246 connected between the resistive element 245 and the voltage supply line that supplies the voltage $V_{CCQ}$ in parallel. The transistor 246 is a PMOS transistor. The n+1 transistors 246 have at least one of mutually different channel widths and mutually different channel lengths, and have mutually different n+1 resistance values. Gate electrodes of the n+1 transistors 246 are connected to respective signal lines Up*<0> to Up*<n> (* is any of 0 to 6). Data of n+1 bits input to the signal lines Up*<0> to Up*<n> is adjusted to have the impedance at the driving of the pull-up circuit 243 of approximately 240Ω.

The pull-down circuit 244 includes a resistive element 247 connected to the data signal input/output terminals DQ0 to DQ7, and m+1 (m is a natural number) transistors 248 connected between the resistive element 247 and the voltage supply line that supplies the ground voltage $V_{Ss}$ in parallel. The transistor 248 is an NMOS transistor. The m+1 transistors 248 have at least one of mutually different channel widths and mutually different channel lengths, and have mutually different m+1 resistance values. Gate electrodes of the m+1 transistors 248 are connected to respective signal lines Dn*<0> to Dn*<m> (* is any of 0 to 6). Data of m+1 bits input to the signal lines Dn*<0> to Dn*<m> is adjusted to have the impedance at the driving of the pull-down circuit 244 of approximately 240Ω.

The OCD unit control circuit 242 includes, for example, n+1 OR circuits 251 and m+1 AND circuits 252.

The n+1 OR circuits 251 include one input terminal connected to an output terminal of a signal propagation circuit 253. The signal propagation circuit 253 propagates a signal of "1" or "0" output from the data signal input/output terminals DQ0 to DQ7. The n+1 OR circuits 251 include the other input terminal to which a corresponding bit in n+1 bit data PCODE<n:0> corresponding to the n+1 transistors 246 included in the pull-up circuit 243 is input. The n+1 OR circuits 251 include output terminals each connected to the gate electrode of the corresponding transistor 246.

The m+1 AND circuits 252 include one input terminal connected to the output terminal of the signal propagation circuit 253. The m+1 AND circuits 252 include the other input terminal to which a corresponding bit in m+1 bit data NCODE<m:0> corresponding to the m+1 transistors 248 included in the pull-down circuit 244 is input. The m+1 AND circuits 252 include output terminals each connected to the gate electrode of the corresponding transistor 248.

The output circuit 250 of FIG. 6 is basically configured similarly to the output circuit 240. The output circuit 250 includes seven OCD units 241 connected to the data strobe signal input/output terminals DQS, /DQS in parallel, and seven OCD unit control circuits 242 connected to the seven OCD units 241. Note that the OCD units 241 include output terminals connected to not any of the data signal input/output terminals DQ0 to DQ7 but the data strobe signal input/output terminal DQS or the data strobe signal input/output terminal /DQS. The signal propagation circuit 253 propagates not the signal of "1" or "0" output from the data signal input/output terminal DQ0 to DQ7 but data strobe signals output from the data strobe signal input/output terminals DQS, /DQS.

[Structure of Memory Die MD]

Figure 9:
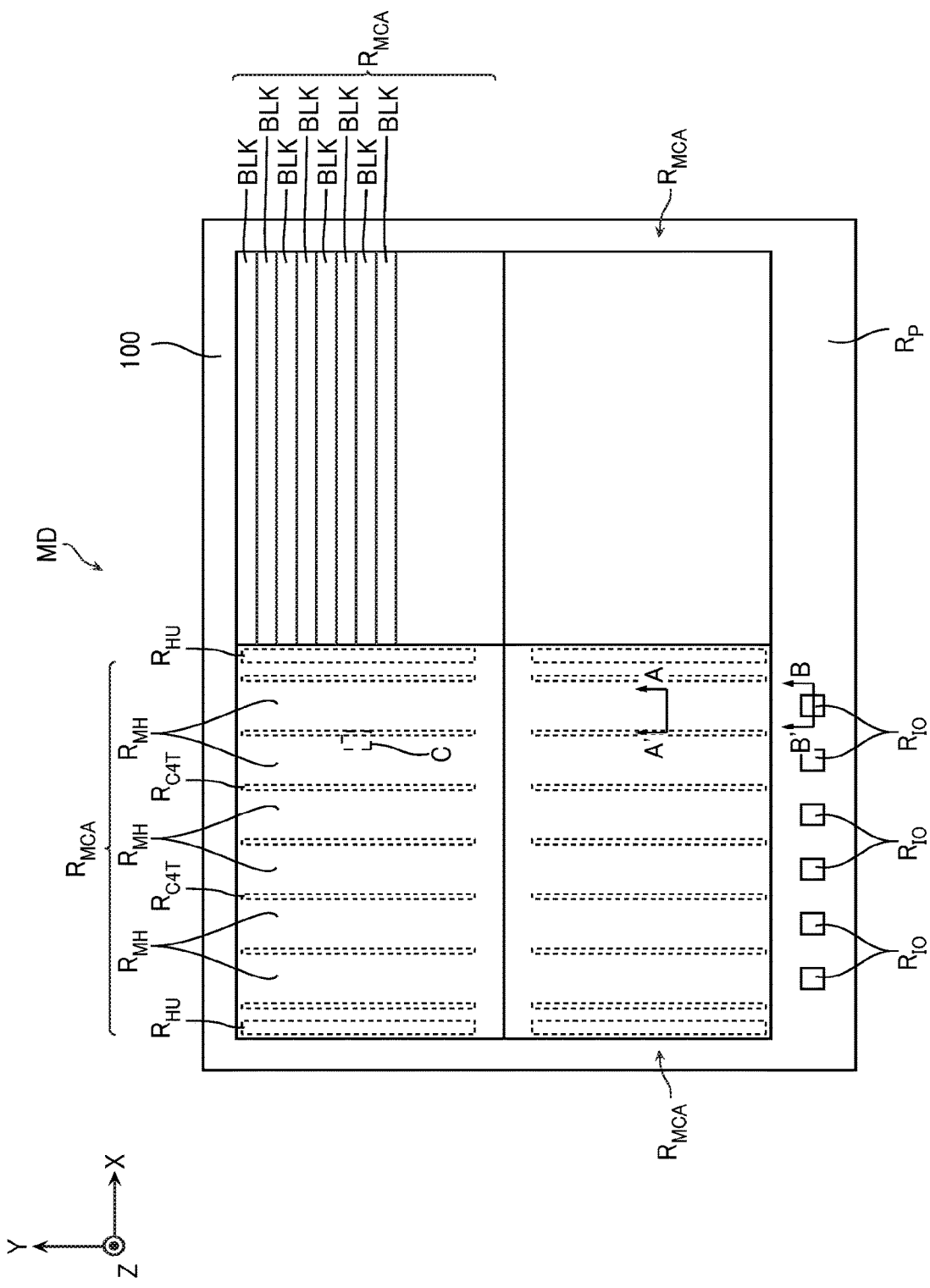
FIG. 9 is a schematic plan view of the memory die MD.
Figure 10:
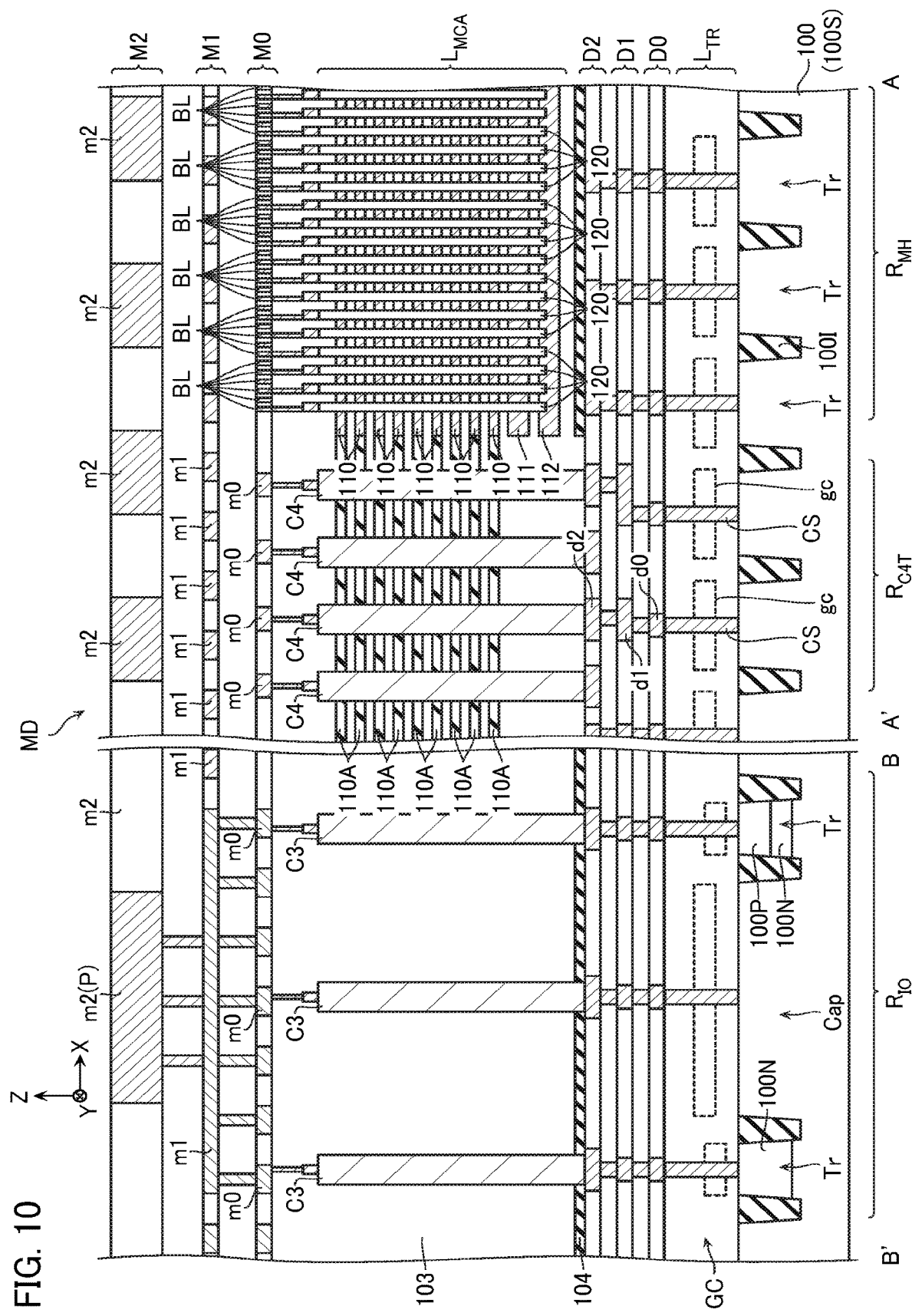
FIG. 10 is a schematic cross-sectional view of the structure illustrated in FIG. 9 taken along the line A-A' and the line B-B' and viewed in the arrow direction.
Figure 11:
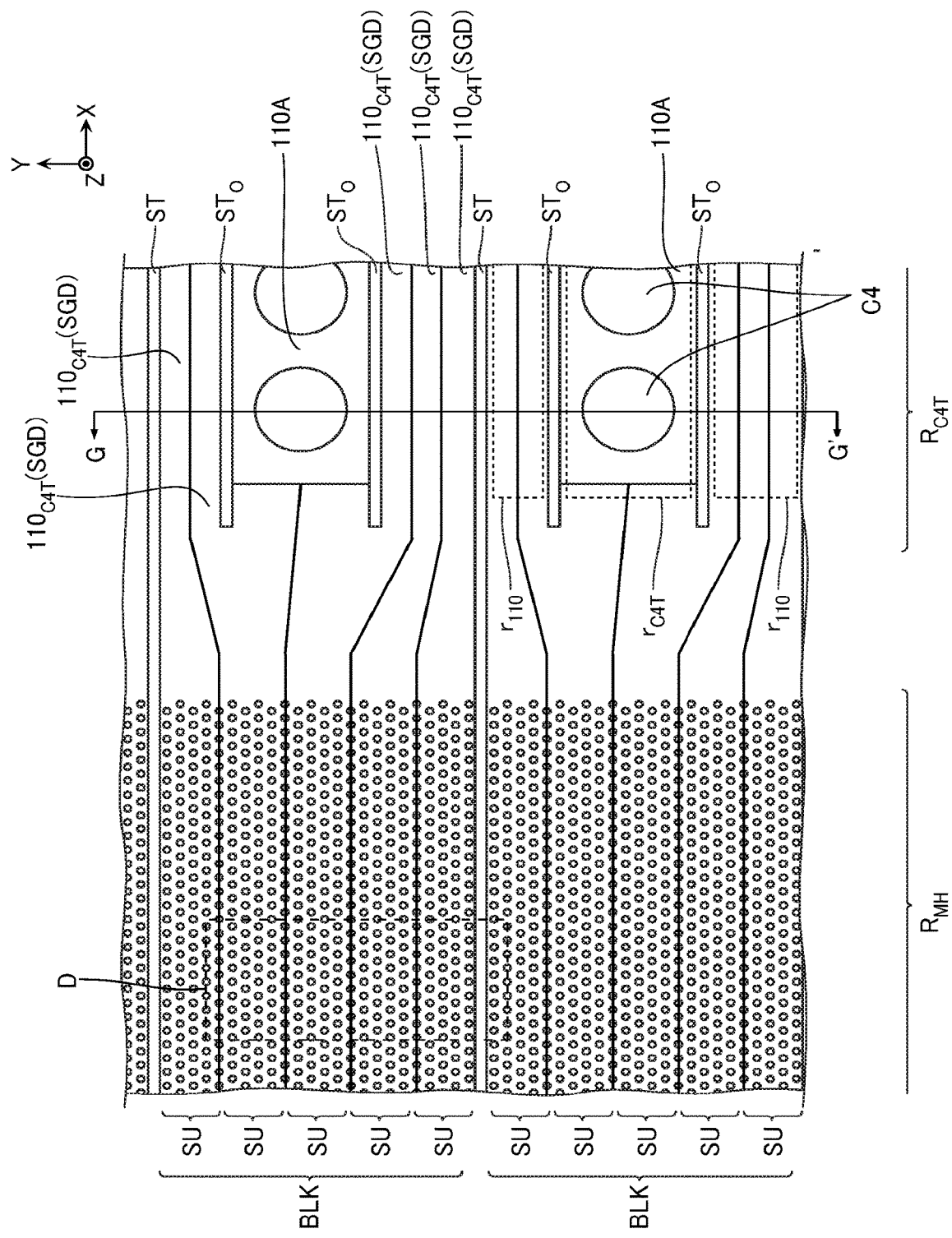
FIG. 11 is a schematic plan view illustrating an enlarged part indicated by C in FIG. 9.
Figure 12:
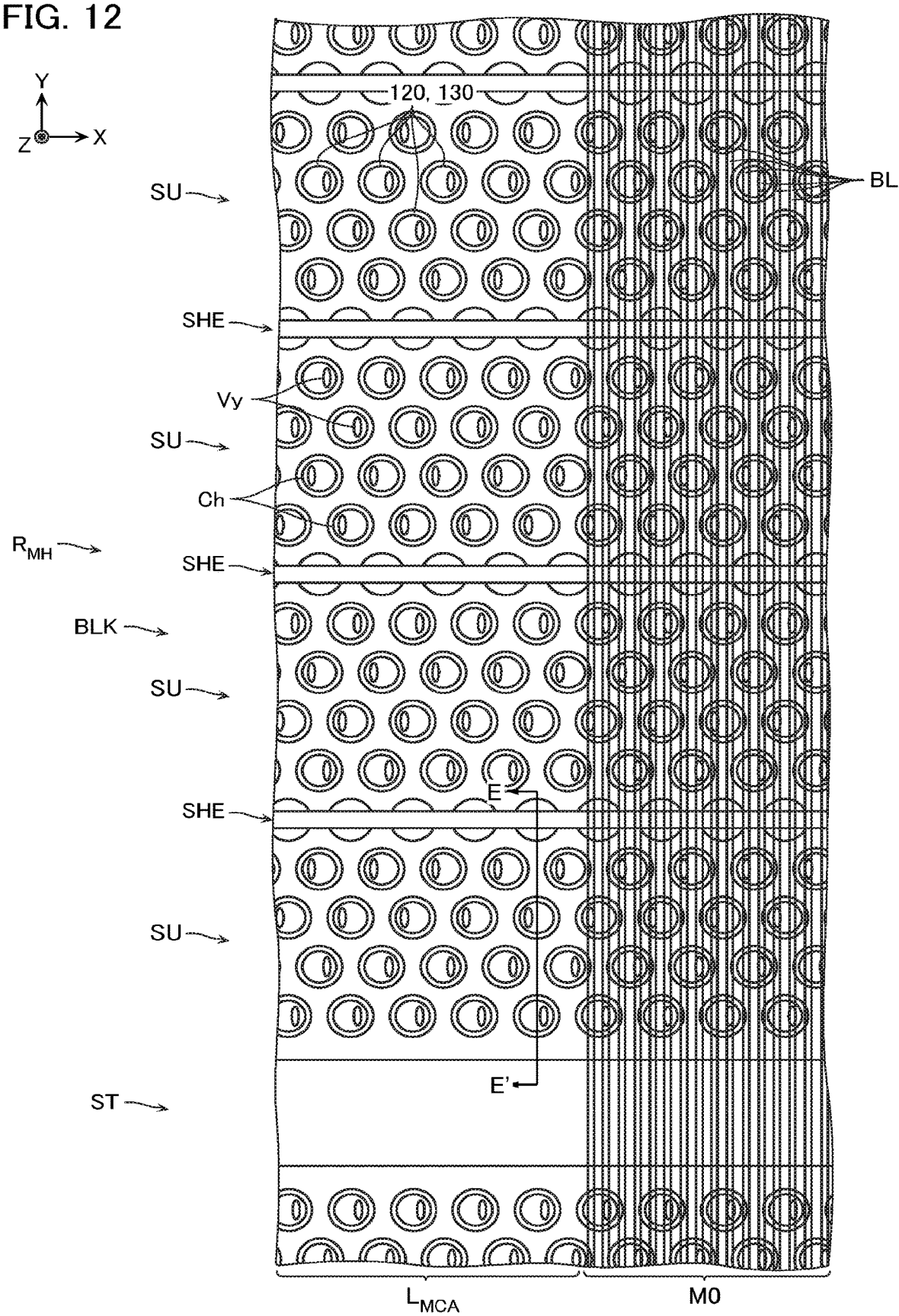
FIG. 12 is a schematic plan view illustrating an enlarged part indicated by D in FIG. 11.
Figure 13:
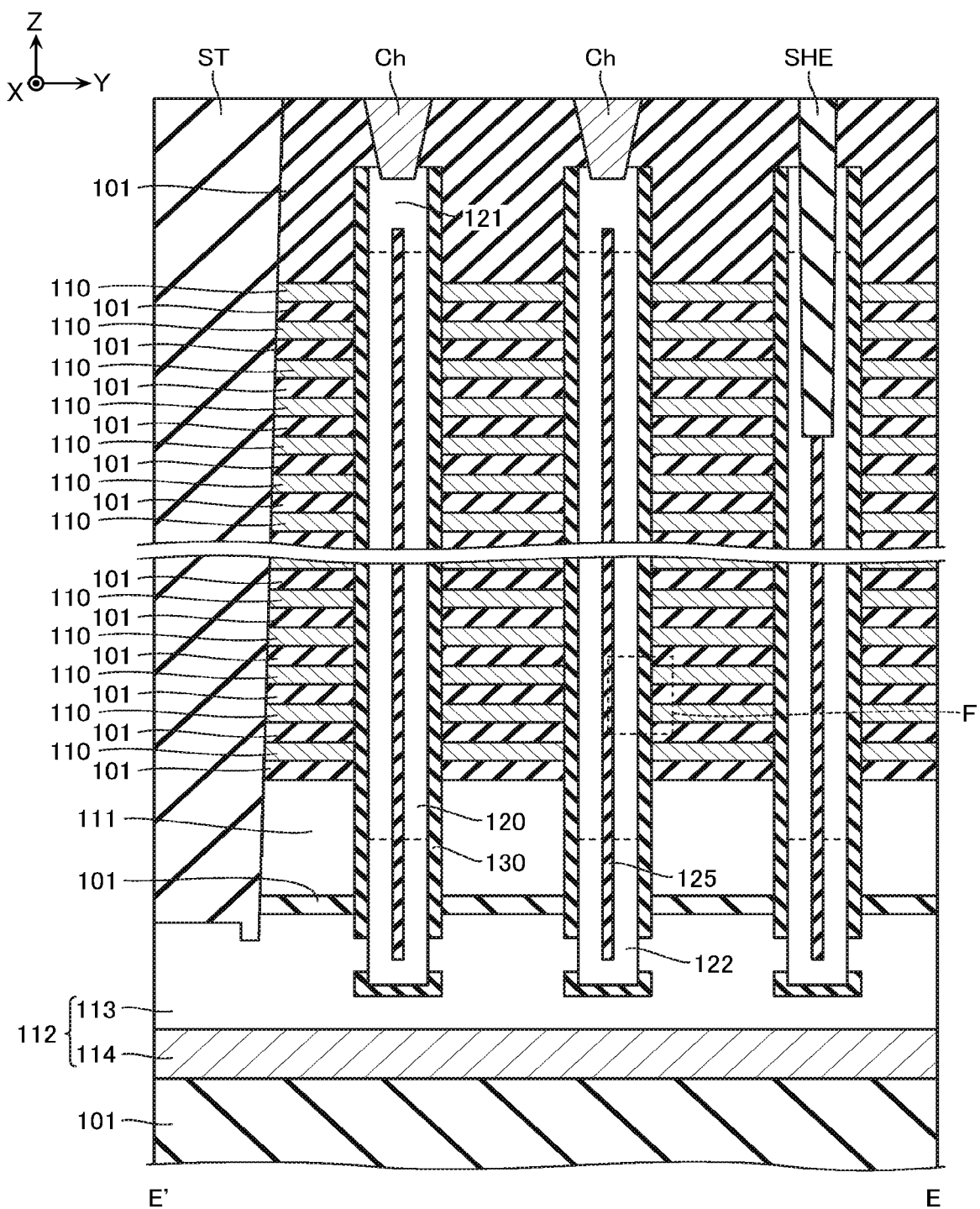
FIG. 13 is a schematic cross-sectional view of the structure illustrated in FIG. 12 taken along the line E-E' and viewed in the arrow direction.
Figure 14:
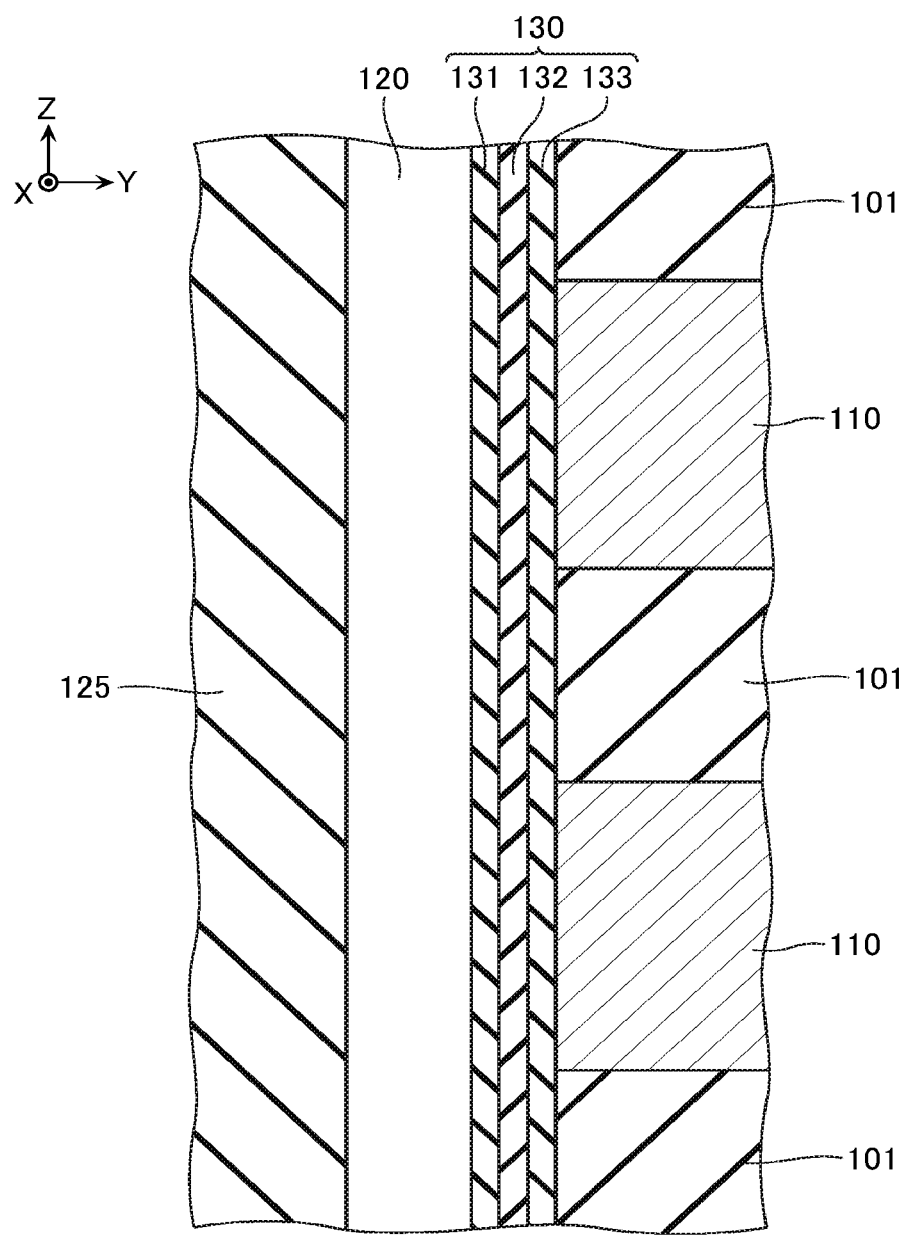
FIG. 14 is a schematic plan view illustrating an enlarged part indicated by F in FIG. 13.
Figure 15:
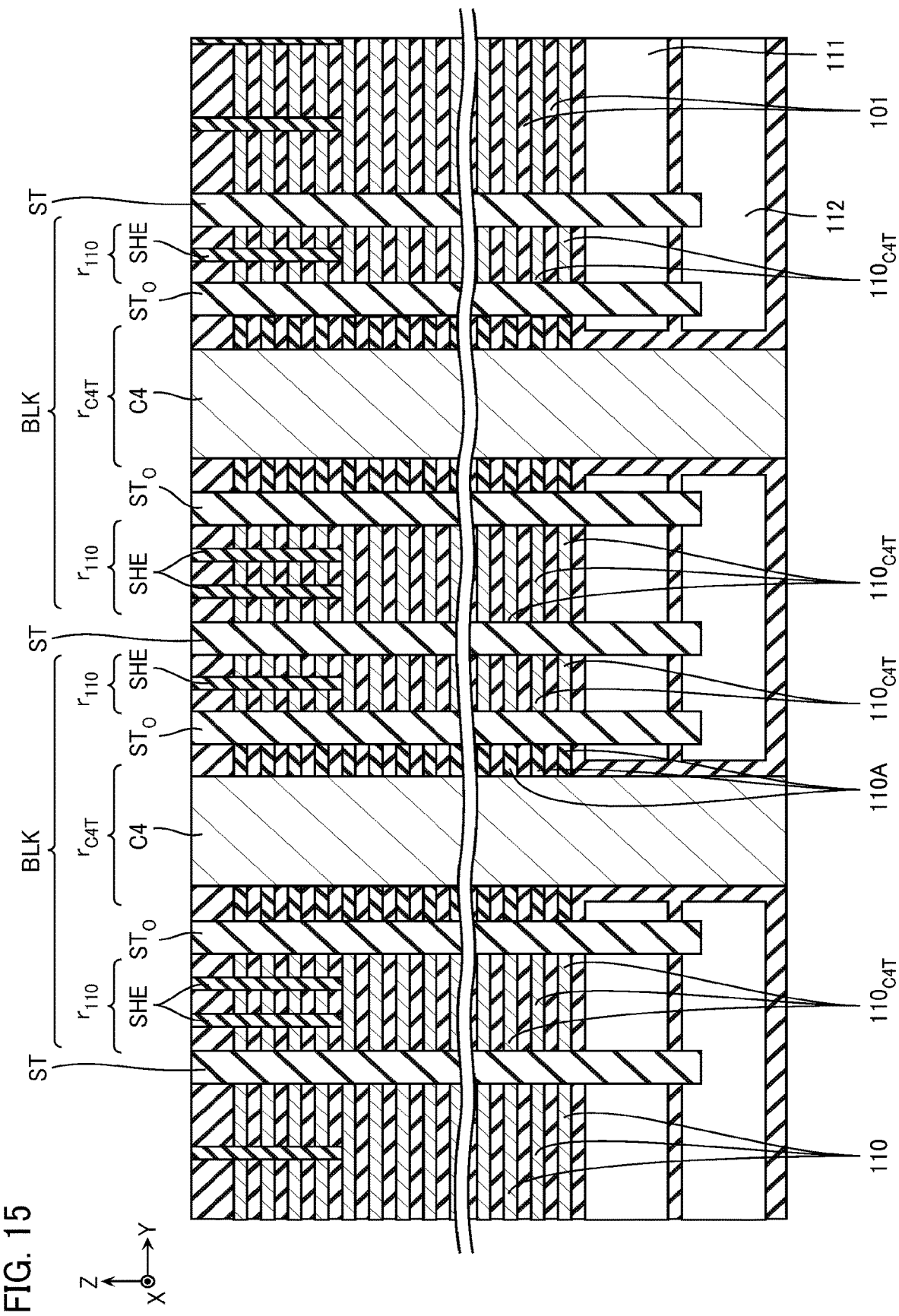
FIG. 15 is a schematic cross-sectional view of the structure illustrated in FIG. 11 taken along the line G-G' and viewed in the arrow direction.

FIG. 9 is a schematic plan view of the memory die MD. FIG. 10 is a schematic cross-sectional view of the structure illustrated in FIG. 9 taken along the line A-A' and the line B-B' and viewed in the arrow direction. FIG. 11 is a schematic plan view illustrating an enlarged part indicated by C in FIG. 9. FIG. 12 is a schematic plan view illustrating an enlarged part indicated by D in FIG. 11. FIG. 13 is a schematic cross-sectional view of the structure illustrated in FIG. 12 taken along the line E-E' and viewed in the arrow direction. FIG. 14 is a schematic plan view illustrating an enlarged part indicated by F in FIG. 13. FIG. 15 is a schematic cross-sectional view of the structure illustrated in FIG. 11 taken along the line G-G' and viewed in the arrow direction.

For example, as illustrated in FIG. 9, the memory die MD includes a semiconductor substrate 100. In the illustrated example, the semiconductor substrate 100 includes four memory cell array regions $R_{MCA}$ arranged in the X-direction and the Y-direction. The memory cell array region $R_{MCA}$ includes a plurality of memory hole regions $R_{MH}$ as "first regions" arranged in the X-direction and a plurality of through contact regions $R_{C4T}$ as "second regions" disposed between the memory hole regions $R_{MH}$. Hook-up regions $R_{HU}$ are disposed on both end portions in the X-direction of the memory cell array region $R_{MCA}$. A peripheral region $R_P$ is disposed in an end portion in the Y-direction of the semiconductor substrate 100. The peripheral region $R_P$ includes a plurality of input/output circuit regions $R_{IO}$ as "third regions" arranged in the X-direction.

For example, as illustrated in FIG. 10, the memory die MD includes the semiconductor substrate 100, a transistor layer $L_{TR}$ disposed on the semiconductor substrate 100, a wiring layer D0 disposed above the transistor layer $L_{TR}$, a wiring layer D1 disposed above the wiring layer D0, a wiring layer D2 disposed above the wiring layer D1, a memory cell array layer $L_{MCA}$ disposed above the wiring layer D2, a wiring layer M0 disposed above the memory cell array layer $L_{MCA}$, a wiring layer M1 disposed above the wiring layer M0, and a wiring layer M2 disposed above the wiring layer M1.

[Structure of Semiconductor Substrate 100]

The semiconductor substrate 100 is, for example, a semiconductor substrate made of P-type silicon (Si) containing P-type impurities, such as boron (B). For example, as illustrated in FIG. 10, in the surface of the semiconductor substrate 100, N-type well regions 100N containing N-type impurities, such as phosphorus (P), a P-type well region 100P containing P-type impurities, such as boron (B), a semiconductor substrate region 100S where the N-type well region 100N or the P-type well region 100P is not disposed, and insulating regions 100I.

[Structure of Transistor layer $L_{TR}$]

For example, as illustrated in FIG. 10, a wiring layer GC is disposed on the upper surface of the semiconductor substrate 100 via an insulating layer (not illustrated). The wiring layer GC includes a plurality of electrodes gc opposed to the surface of the semiconductor substrate 100. Respective regions of the semiconductor substrate 100 and the plurality of electrodes gc included in the wiring layer GC are each connected to a contact CS.

The N-type well region 100N, the P-type well region 100P, and the semiconductor substrate region 100S of the semiconductor substrate 100 each function as a channel region of the plurality of transistors Tr, one electrodes of a plurality of capacitors Cap, and the like constituting the peripheral circuit PC.

The respective plurality of electrodes gc included in the wiring layer GC function as the gate electrodes of the plurality of transistors Tr, the other electrodes of the plurality of capacitors Cap, and the like constituting the peripheral circuit PC.

The contact CS extends in the Z direction and is connected to the semiconductor substrate 100 or the upper surface of the electrode gc at a lower end. In a connection part between the contact CS and the semiconductor substrate 100, an impurity region containing N-type impurities or P-type impurities is disposed. For example, the contact CS may include a stacked film of a barrier conductive film, such as titanium nitride (TiN), and a metal film, such as tungsten (W), or the like.

In the illustrated example, the capacitor Cap is disposed at a region in the input/output circuit region $R_{IO}$ overlapping with a pad electrode P viewed in the Z-direction. Additionally, the plurality of transistors Tr disposed in the input/output circuit region $R_{IO}$, for example, function as a plurality of transistors constituting the input circuits 210, 220, the input buffer circuit 230, and the output circuits 240, 250, which have been described with reference to FIG. 6 to FIG. 8.

[Structures of Wiring Layers D0, D1, D2]

For example, as illustrated in FIG. 10, the plurality of wirings included in the wiring layers D0, D1, D2 are electrically connected to at least one of the configurations in the memory cell array MCA and the configurations in the peripheral circuit PC.

The respective wiring layers D0, D1, D2 include a plurality of wirings d0, d1, d2. For example, the plurality of wirings d0, d1, d2 may include a stacked film of a barrier conductive film, such as titanium nitride (TiN), and a metal film, such as tungsten (W), or the like.

In the illustrated example, an insulating layer 104, such as silicon nitride (SiN), is disposed on the upper surface of the wiring layer D2. The insulating layer 104 covers the configurations in the wiring layer D2 across the entire surface. However, the insulating layer 104 is not disposed at at least a part of the through contact region $R_{C4T}$.

[Structures in Memory Hole Region $R_{MH}$ of Memory Cell Array Layer $L_{MCA}$]

For example, as illustrated in FIG. 9, in the memory cell array layer $L_{MCA}$, the plurality of memory blocks BLK arranged in the Y-direction are disposed. For example, as illustrated in FIG. 11, the memory block BLK includes the plurality of string units SU arranged in the Y-direction. Between the two memory blocks BLK adjacent in the Y-direction, an inter-block insulating layer ST, such as silicon oxide ($SiO_2$), is disposed. For example, as illustrated in FIG. 12, between the two string units SU adjacent in the Y-direction, an inter-string unit insulating layer SHE, such as silicon oxide ($SiO_2$), is disposed.

For example, as illustrated in FIG. 13, the memory block BLK includes a plurality of conductive layers 110 arranged in the Z-direction, a plurality of semiconductor layers 120 extending in the Z-direction, and a respective plurality of gate insulating films 130 disposed between the plurality of conductive layers 110 and the plurality of semiconductor layers 120.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide ($SiO_2$), are disposed.

A conductive layer 111 is disposed below the conductive layer 110. For example, the conductive layer 111 may contain polycrystalline silicon containing impurities, such as phosphorus (P) or boron (B), or the like. Between the conductive layer 111 and the conductive layer 110, the insulating layer 101, such as silicon oxide ($SiO_2$), is disposed.

A conductive layer 112 is disposed below the conductive layers 111. The conductive layer 112 includes a semiconductor layer 113 connected to lower ends of the semiconductor layers 120 and a conductive layer 114 connected to a lower surface of the semiconductor layer 113. For example, the semiconductor layer 113 may contain polycrystalline silicon containing impurities, such as phosphorus (P) or boron (B), or the like. The conductive layer 114 may include, for example, any conductive layer including a conductive layer containing a metal, such as tungsten (W), or tungsten silicide. Between the conductive layer 112 and the conductive layer 111, the insulating layer 101, such as silicon oxide ($SiO_2$), is disposed.

The conductive layer 112 functions as the source line SL (FIG. 5). The source line SL is, for example, disposed in common between all of the memory blocks BLK included in the memory cell array region $R_{MCA}$ (FIG. 9).

The conductive layers 111 function as the source-side select gate lines SGSb (FIG. 5) and gate electrodes of the plurality of source-side select transistors STSb connected to the source-side select gate line SGSb. The conductive layers 111 are electrically independent in every memory block BLK.

Among the plurality of conductive layers 110, the one or plurality of conductive layers 110 positioned at the lowermost layer function as the source-side select gate line SGSb (FIG. 5) and gate electrodes of the plurality of source-side select transistors STS connected thereto. The plurality of conductive layers 110 are electrically independent in every memory block BLK.

The plurality of conductive layers 110 positioned above this layer function as the word lines WL (FIG. 5) and gate electrodes of the plurality of memory cells MC (FIG. 5) connected to the word lines WL. The plurality of conductive layers 110 are each electrically independent in every memory block BLK.

The one or plurality of conductive layers 110 positioned above these conductive layers 110 function as the drain-side select gate lines SGD and gate electrodes of the plurality of drain-side select transistors STD (FIG. 5) connected to the drain-side select gate line SGD. The plurality of conductive layers 110 have widths in the Y-direction smaller than those of the other conductive layers 110. Between the two conductive layers 110 adjacent in the Y-direction, the inter-string unit insulating layer SHE is disposed. The plurality of conductive layers 110 are each electrically independent in every string unit SU.

For example, as illustrated in FIG. 12, the semiconductor layers 120 are arranged in the X-direction and the Y-direction in a predetermined pattern. The semiconductor layers 120 function as the channel regions of the plurality of memory cells MC and the select transistors (STD, STS, STSb) included in one memory string MS (FIG. 5). The semiconductor layer 120 is, for example, a semiconductor layer, such as polycrystalline silicon (Si). For example, as illustrated in FIG. 13, the semiconductor layer 120 has a substantially closed-bottomed cylindrical shape and includes an insulating layer 125, such as silicon oxide, in the center part. The outer peripheral surfaces of the semiconductor layers 120 are each surrounded by the conductive layers 110 and opposed to the conductive layers 110.

An impurity region 121 containing N-type impurities, such as phosphorus (P), is disposed on the upper end portion of the semiconductor layer 120. The impurity regions 121 are connected to the bit lines BL via contacts Ch and contacts Vy (FIG. 12).

An impurity region 122 containing N-type impurities, such as phosphorus (P), is disposed on the lower end portion of the semiconductor layer 120. The impurity regions 122 are connected to the semiconductor layer 113 in the conductive layer 112. In the semiconductor layer 120, a part positioned immediately above the impurity region 122 functions as a channel region of the source-side select transistor STSb. An outer peripheral surface of the impurity region 122 is surrounded by the conductive layer 111 and opposed to the conductive layer 111.

The gate insulating film 130 has a substantially closed-bottomed cylindrical shape that covers the outer peripheral surface of the semiconductor layer 120. The gate insulating film 130 includes, for example, as illustrated in FIG. 14, a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films of silicon oxide ($SiO_2$) or the like. The electric charge accumulating film 132 is, for example, a film that can accumulate an electric charge of silicon nitride ($Si_3N_4$) or the like. The tunnel insulating film 131, the electric charge accumulating film 132, and the block insulating film 133, which have substantially cylindrical shapes, extend in the Z-direction along the outer peripheral surface of the semiconductor layer 120.

FIG. 14 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

[Structure in Through Contact Region $R_{C4T}$ of Memory Cell Array Layers $L_{MCA}$]

For example, as illustrated in FIG. 11, the through contact region. $R_{C4T}$ includes two insulating layers $ST_O$ arranged in the Y-direction between the two inter-block insulating layers ST arranged in the Y-direction. Between these two insulating layers $S_{TO}$, a contact connection sub-region $r_{C4T}$ is disposed. Between the inter-block insulating layer ST and the insulating layer $ST_O$, a conductive layer connection sub-region $r_{110}$ is disposed. These regions extend in the X-direction along the inter-block insulating layer ST.

For example, as illustrated in FIG. 15, the insulating layer $ST_O$ extends in the Z-direction and has a lower end connected to the conductive layer 112. The insulating layer $ST_O$ contains, for example, silicon oxide ($SiO_2$).

The contact connection sub-region $r_{C4T}$ includes a plurality of insulating layers 110A arranged in the Z-direction and a plurality of contacts C4 as "first contacts" extending in the Z-direction.

The insulating layer 110A is a substantially plate-shaped insulating layer extending in the X-direction. The insulating layer 110A may include an insulating layer, such as silicon nitride (SiN). Between the plurality of insulating layers 110A arranged in the Z-direction, the insulating layers 101, such as silicon oxide ($SiO_2$), are disposed.

For example, as illustrated in FIG. 10, the plurality of contacts C4 are arranged in the X-direction. The contact C4 may include a stacked film of a barrier conductive film, such as titanium nitride (TiN), and a metal film, such as tungsten (W), or the like. Outer peripheral surfaces of the contacts C4 are each surrounded by the insulating layers 110A and the insulating layers 101 and are connected to these insulating layers 110A and insulating layers 101. The contact C4 extends in the Z-direction, has an upper end connected to the wiring m0 in the wiring layer M0 and a lower end connected to the wiring d2 in the wiring layer D2.

For example, as illustrated in FIG. 11, the conductive layer connection sub-region $r_{110}$ includes narrow-width portions $110_{C4T}$ of the plurality of conductive layers 110 arranged in the Z-direction. The plurality of conductive layers 110 included in the two memory hole regions $R_{MH}$ adjacent in the X-direction are electrically conducted with one another via the narrow-width portions $110_{C4T}$.

[Structure of Memory Cell Array Layer $L_{MCA}$ in Input/Output Circuit Region $R_{IO}$]

For example, as illustrated in FIG. 10, the input/output circuit region $R_{IO}$ includes an insulating layer 103, such as silicon oxide ($SiO_2$), and a plurality of contacts C3 extending in the Z-direction.

The contact C3 may include a stacked film of a barrier conductive film, such as titanium nitride (TiN), and a metal film, such as tungsten (W), or the like. Outer peripheral surfaces of the contacts C3 are each surrounded by the insulating layer 103 and connected to the insulating layer 103. The contact C3 extends in the Z-direction, has an upper end connected to the wiring m0 in the wiring layer M0 and a lower end connected to the wiring d2 in the wiring layer D2.

[Structures of Wiring Layers M0, M1, M2]

For example, as illustrated in FIG. 10, the plurality of wirings included in the wiring layers M0, M1, M2 are electrically connected to, for example, at least one of the configurations in the memory cell array $L_{MCA}$ and the configurations in the transistor layer $L_{TR}$.

The wiring layer M0 includes the plurality of wirings m0. For example, the plurality of wirings m0 may include a stacked film of a barrier conductive film, such as titanium nitride (TiN), and a metal film, such as copper (Cu), or the like. Note that a part of the plurality of wirings m0 function as the bit lines BL (FIG. 5). For example, as illustrated in FIG. 12, the bit lines BL are arranged in the X-direction and extend in the Y-direction. The plurality of bit lines BL are each connected to one semiconductor layer 120 included in each string unit SU.

The wiring layer M1 includes the plurality of wirings m1. For example, the plurality of wirings m1 may include a stacked film of a barrier conductive film, such as titanium nitride (TiN), and a metal film, such as copper (Cu), or the like.

The wiring layer M2 includes the plurality of wirings m2. For example, the plurality of wirings m2 may include a stacked film of a barrier conductive film, such as titanium nitride (TiN), and a metal film, such as aluminum (Al), or the like. Note that a part of the plurality of wirings m2 disposed in the peripheral region $R_P$ function as the pad electrodes P (FIG. 2, FIG. 3).

[Arrangement of Input/Output Circuit Region $R_{IO}$]

Figure 16:
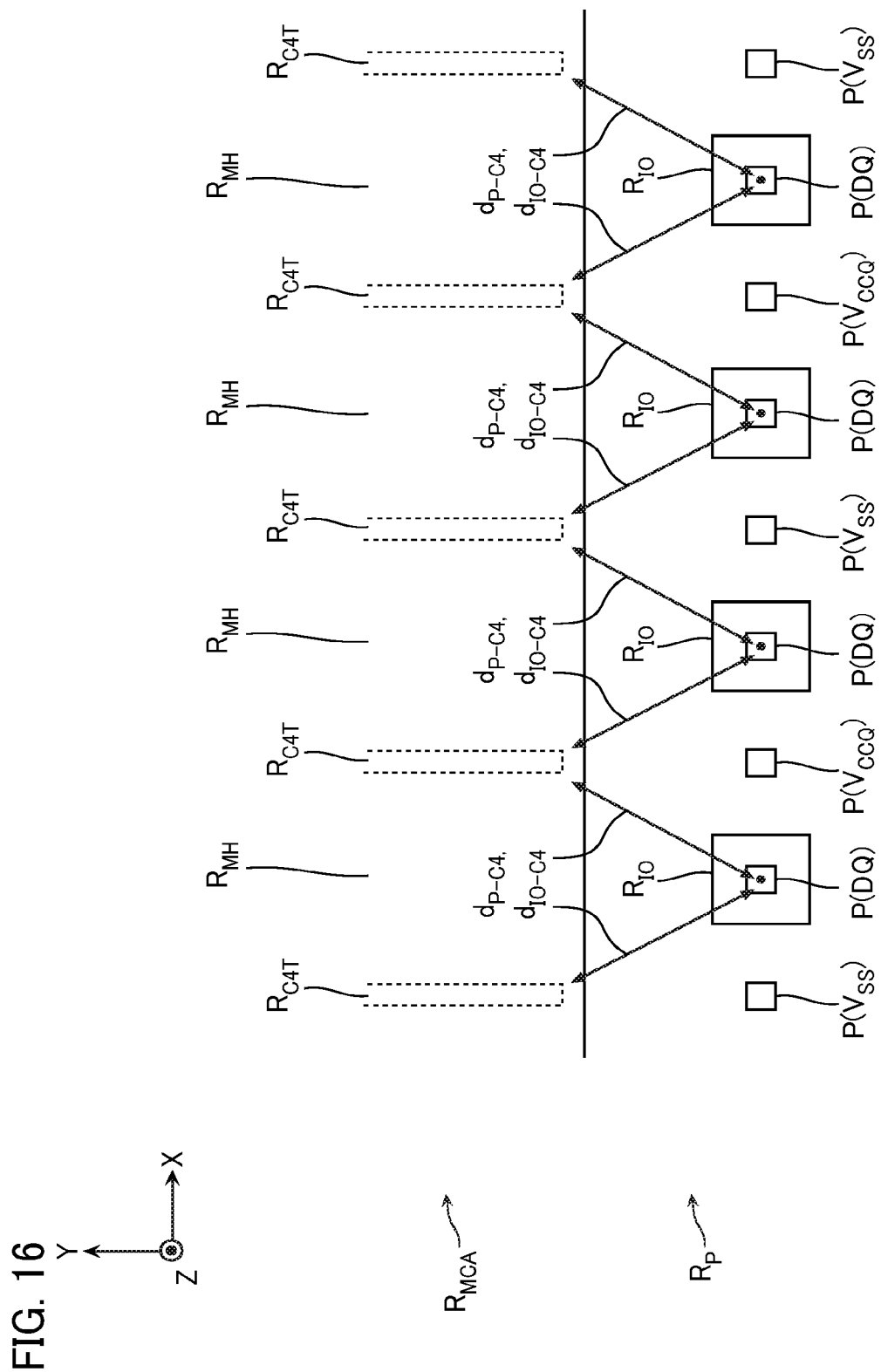
FIG. 16 is a schematic plan view illustrating an enlarged part in FIG. 8.

FIG. 16 is a schematic plan view illustrating an enlarged part of FIG. 9. The peripheral region $R_P$ includes the plurality of pad electrodes P arranged in the X-direction. Among the plurality of pad electrodes P, the pad electrodes P that function as the data signal input/output terminals DQ0 to DQ7 or the data strobe signal input/output terminals DQS, /DQS (hereinafter referred to as "input/output pad electrodes P(DQ)" in some cases) are disposed in the input/output circuit regions $R_{IO}$.

In the example of FIG. 16, the positions of the plurality of pad electrodes P in the Y-direction are all matched. The center positions in the X-direction of the plurality of input/output pad electrodes P(DQ) and intermediate positions in the X-direction of the two through contact regions $P_{C4T}$ adjacent in the X-direction are each matched. That is, in the example of FIG. 16, when a distance from the center position of the input/output pad electrode P(DQ) on the X-Y plane to the center position of the contact C4 closest to this input/output pad electrode P(DQ) on the X-Y plane in the through contact region $R_{C4T}$ closest to this input/output pad electrode P(DQ) is defined as a distance $d_{P-C4}$, the distances $d_{P-C4}$ of all of the input/output pad electrodes P(DQ) are same.

All of the distances $d_{P-C4}$ corresponding to all of the input/output pad electrodes P(DQ) are preferably the same. However, there is a case where the distances $d_{P-C4}$ are not completely matched due to a convenience of design, a manufacturing error, or the like. In such a case, for example, a difference between the maximum value and the minimum value of the distance $d_{P-C4}$ is preferably 400 nm or less.

In the example of FIG. 16, the positions of the plurality of input/output circuit regions $R_{IO}$ in the Y-direction are all matched. The center positions in the X-direction of the plurality of input/output circuit regions $R_{IO}$ and the intermediate positions in the X-direction of the two through contact regions $R_{C4T}$ adjacent in the X-direction are each matched. That is, in the example of FIG. 16, when a distance from the center position of the input/output circuit region $R_{IO}$ on the X-Y plane to the center position of the contact C4 closest to this input/output circuit region $R_{IO}$ on the X-Y plane in the through contact region $R_{C4T}$ closest to this input/output circuit region $R_{IO}$ is defined as a distance $d_{IO-C4}$, the distances $d_{IO-C4}$ of all of the input/output circuit regions $R_{IO}$ are the same.

For example, when viewed along the Y-direction, the through contact region $R_{C4T}$ does not overlap with the input/output circuit region $R_{IO}$ (input/output pad electrode P(DQ)). That is, when viewed along the Y-direction, the contact C4 closest to the input/output circuit region $R_{IO}$ (input/output pad electrode P(DQ)) does not overlap with the input/output circuit region $R_{IO}$ (input/output pad electrode P(DQ)). At this time, all of the input/output circuit regions $R_{IO}$ (input/output pad electrodes P(DQ)) may be disposed not to overlap with the through contact regions $R_{C4T}$ along the Y-direction. For example, when viewed along the Y-direction, the through contact regions $R_{C4T}$ may overlap with power supply pad electrodes $P(V_{SS})$, $P(V_{CCQ})$ When viewed along the Y-direction, the through contact regions $R_{C4T}$ may be disposed not to overlap with the power supply pad electrodes $P(V_{SS})$, $P(V_{CCQ})$.

For example, in FIG. 16, the power supply pad electrodes $P(V_{SS})$, $P(V_{CCQ})$ and the input/output circuit region $R_{IO}$ (input/output pad electrode P(DQ)) may be substituted for one another. Also with such a substitution, the distances $d_{IO-C4}$ of all of the input/output circuit regions $R_{IO}$ can be made the same.

Note that all of the distances $d_{IO-C4}$ corresponding to all of the input/output circuit regions $R_{IO}$ are preferably the same. However, there is a case where the distances $d_{IO-C4}$ are not completely matched due to a convenience of design, a manufacturing error, or the like. In such a case, for example, a difference between the maximum value and the minimum value of the distance $d_{IO-C4}$ is preferably 400 nm or less.

[Transistors Tr Disposed in Input/Output Circuit Region $R_{IO}$]

As described above, in the transistor layer $L_{TR}$ of the memory die MD, the plurality of transistors Tr constituting the peripheral circuit PC are disposed. The plurality of transistors Tr include high-voltage transistors to which a comparatively large voltage is supplied and low-voltage transistors to which a comparatively small voltage is supplied. The low-voltage transistor can be operated at higher speed than the high-voltage transistor.

As described above, in the input/output circuit region $R_{IO}$, the plurality of transistors constituting the input circuits 210, 220, the input buffer circuit 230, and the output circuits 240, 250, which have been described with reference to FIG. 6 to FIG. 8, are disposed. As the plurality of transistors, the low-voltage transistors as described above are employed. Hereinafter, among the low-voltage transistors, an N-type transistor will be referred to as a transistor $Tr_{NL}$ and a P-type transistor will be referred to as a transistor $Tr_{PL}$ in some cases.

Figure 17:
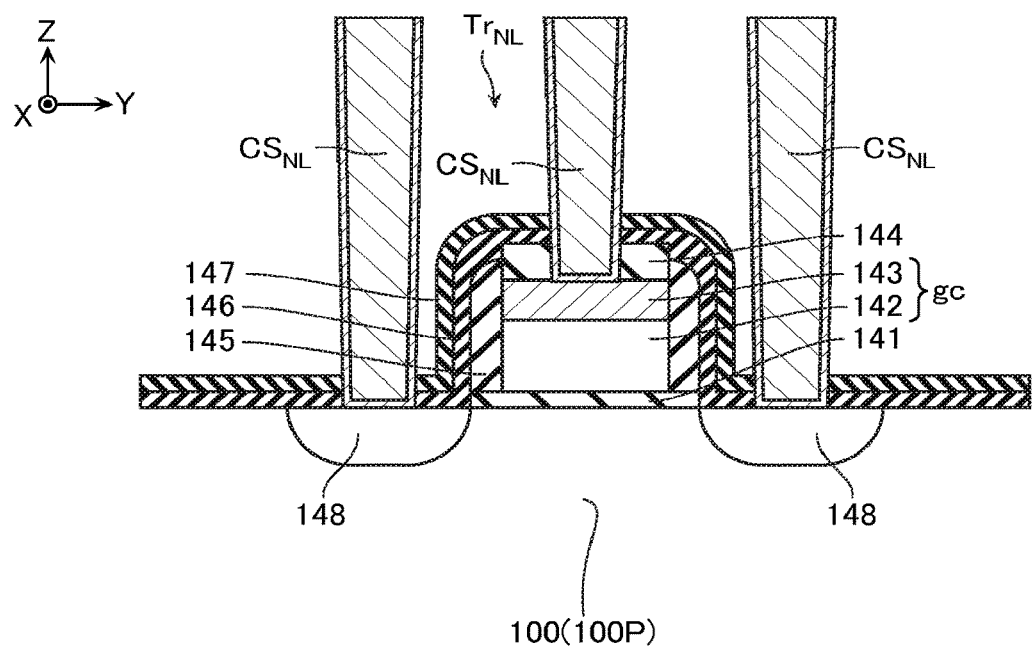
FIG. 17 is a schematic cross-sectional view illustrating a configuration of a part of the memory die MD.

For example, as illustrated in FIG. 17, the N-type transistor $Tr_{NL}$ is disposed in the P-type well region 100P of the semiconductor substrate 100. The transistor $Tr_{NL}$ includes a part of the P-type well region 100P, a gate insulating layer 141, such as silicon oxide ($SiO_2$), disposed on the surface of the semiconductor substrate 100, a gate electrode member 142, such as polycrystalline silicon (Si), containing N-type impurities, such as phosphorus (P) or arsenic (As), disposed on the upper surface of the gate insulating layer 141, a gate electrode member 143 containing tungsten (W), tungsten silicide (WSi), or the like disposed on the upper surface of the gate electrode member 142, cap insulating layers 144, such as silicon nitride ($Si_3N_4$), disposed on the upper surface of the gate electrode member 143, and sidewall insulating layers 145, such as silicon nitride ($Si_3N_4$), disposed on side surfaces in the X-direction or the Y-direction of the gate electrode member 142, the gate electrode member 143, and the cap insulating layers 144. The gate electrode members 142, 143 constitute the above-described electrode gc.

Additionally, the N-type transistor $Tr_{NL}$ includes liner insulating layers 146, such as silicon oxide ($SiO_2$), and liner insulating layers 147, such as silicon nitride ($Si_3N_4$) stacked on the surface of the semiconductor substrate 100, the side surfaces in the X-direction or the Y-direction of the gate insulating layer 141, the side surfaces in the X-direction or the Y-direction of the sidewall insulating layers 145, and the upper surfaces of the cap insulating layers 144.

To the N-type transistor $Tr_{NL}$, three contacts $CS_{NL}$ extending in the Z-direction are connected. For example, the contact $CS_{NL}$ may include a stacked film of a barrier conductive film, such as titanium nitride (TiN), and a metal film, such as tungsten (W), or the like. One of the three contacts $CS_{NL}$ penetrates the liner insulating layer 147, the liner insulating layer 146, and the cap insulating layer 144 and is connected to the upper surface of the gate electrode member 143 to function as a part of the gate electrode of the transistor $Tr_{NL}$. The two contacts $CS_{NL}$ among the three contacts $CS_{NL}$ penetrate the liner insulating layers 147 and the liner insulating layers 146 and are connected to the surface of the semiconductor substrate 100 to function as a source electrode or a drain electrode of the transistor $Tr_{NL}$.

In the N-type transistor $Tr_{NL}$, a surface of the semiconductor substrate 100 opposed to the gate electrode member 142 is a channel region. Impurity regions 148 are disposed on connecting parts with the contacts $CS_{NL}$ of the surface of the semiconductor substrate 100. For example, the impurity region 148 contains N-type impurities, such as phosphorus (P) or arsenic (As).

Figure 18:
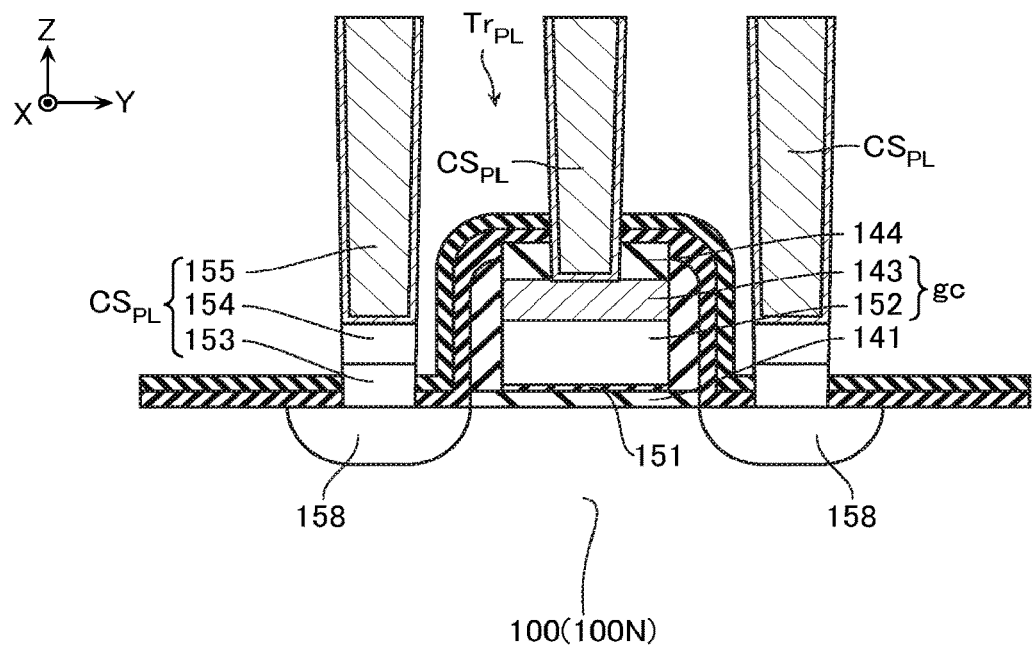
FIG. 18 is a schematic cross-sectional view illustrating a configuration of a part of the memory die MD.

For example, as illustrated in FIG. 18, a P-type transistor $Tr_{PL}$ is configured basically similarly to the N-type transistor $Tr_{NL}$.

However, the P-type transistor $Tr_{PL}$ is disposed in the N-type well region 100N, not the P-type well region 100P.

Additionally, the P-type transistor $Tr_{PL}$ includes an insulating layer 151, such as silicon nitride (SiN), disposed between the gate insulating layer 141 and a gate electrode member 152.

Moreover, the P-type transistor $Tr_{PL}$ includes the gate electrode member 152 instead of the gate electrode member 142. The gate electrode member 152 contains, polycrystalline silicon containing P-type impurities, such as boron (B), or the like.

Three contacts $CS_{PL}$ are connected to the P-type transistor $Tr_{PL}$ instead of the three contacts $CS_{NL}$. Among these three contacts $CS_{PL}$, the one connected to a drain region or a source region of the transistor $Tr_{PL}$ includes a semiconductor layer 153 connected to the semiconductor substrate 100, a semiconductor layer 154 connected to the semiconductor layer 153, and a conductive layer 155 connected to the semiconductor layer 154. The semiconductor layer 153 and the semiconductor layer 154 are, for example, semiconductor layers, such as single-crystal silicon (Si), formed by means, such as epitaxial growth. The semiconductor layer 154 contains P-type impurities, such as boron (B). The semiconductor layer 153 may contain P-type impurities, such as boron (B), or needs not to contain P-type impurities. When the semiconductor layer 153 contains the P-type impurities, the impurity concentration of the P-type impurities contained in the semiconductor layer 153 is smaller than the impurity concentration of the P-type impurities contained in the semiconductor layer 154. For example, the conductive layer 155 may contain a stacked film of a barrier conductive film, such as titanium nitride (TiN), and a metal film, such as tungsten (W), or the like.

The P-type transistor $Tr_{PL}$ includes impurity regions 158 instead of the impurity regions 148. For example, the impurity region 158 contains P-type impurities, such as boron (B).

[Manufacturing Method]

Next, with reference to FIG. 19 to FIG. 34, the method for manufacturing the memory die MD is described. FIG. 19 to FIG. 21, FIG. 23, FIG. 25 to FIG. 29, FIG. 31, and FIG. 33 are schematic cross-sectional views for describing the manufacturing method and illustrate cross-sectional surfaces corresponding to FIG. 13. FIG. 22, FIG. 24, FIG. 30, FIG. 32, and FIG. 34 are schematic cross-sectional views for describing the manufacturing method and illustrate cross-sectional surfaces corresponding to FIG. 15.

To manufacture the memory die MD according to the embodiment, first, on the semiconductor substrate 100, the transistor layer $L_{TR}$, the wiring layer D0, the wiring layer D1, and the wiring layer D2 (FIG. 10) are formed. Additionally, the insulating layer 104 and the insulating layer 101 are formed on the upper surface of the wiring layer D2.

Figure 19:
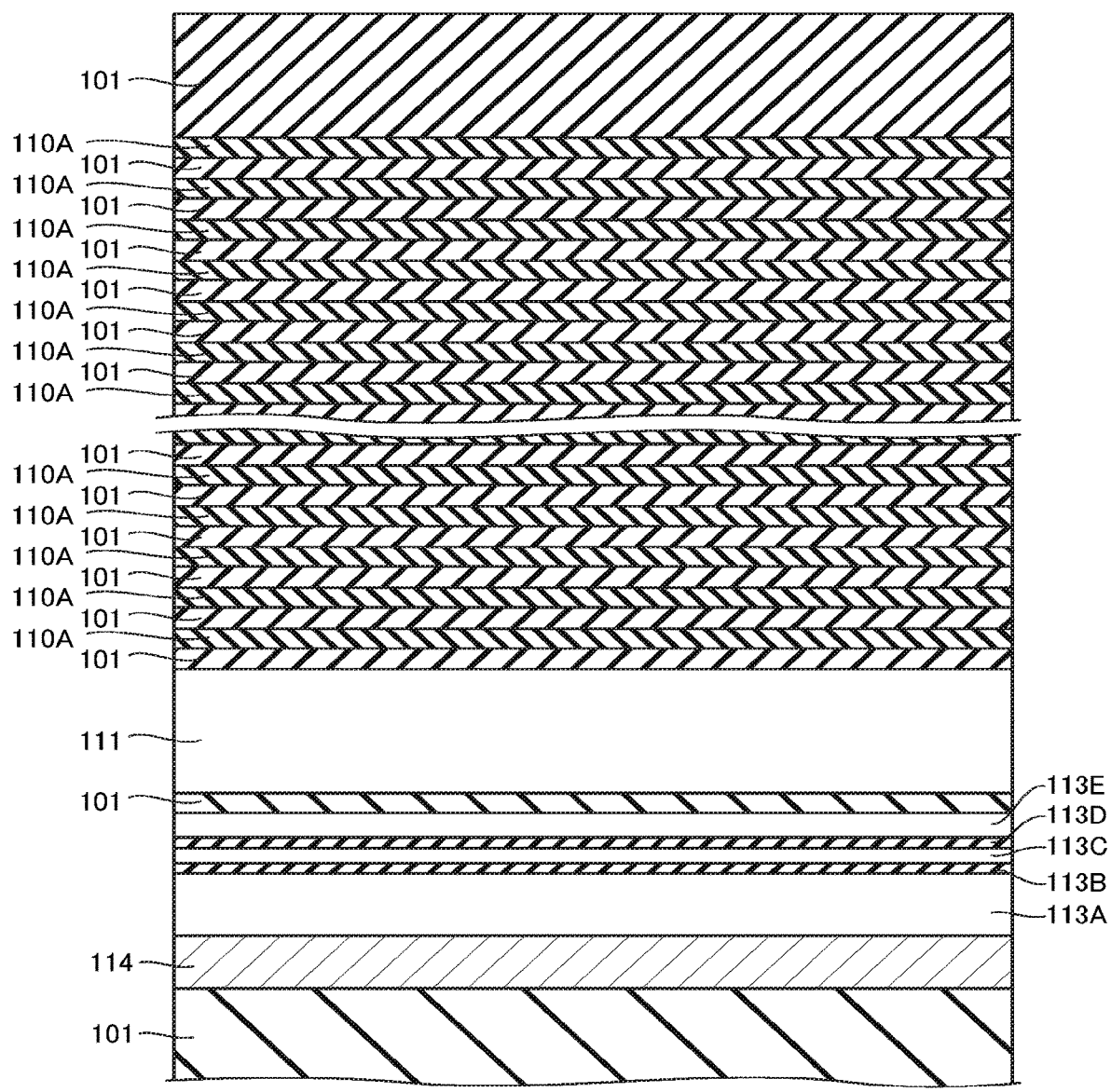
FIG. 19 is a schematic cross-sectional view illustrating a method for manufacturing the memory die MD.

Next, for example, as illustrated in FIG. 19, on the insulating layer 101, the conductive layer 114, a semiconductor layer 113A, such as silicon, a sacrifice layer 113B, such as silicon oxide, a sacrifice layer 113C, such as silicon, a sacrifice layer 113D, such as silicon oxide, a semiconductor layer 113E, such as silicon, and the insulating layer 101 and the conductive layer 111 are formed. The plurality of insulating layers 101 and the plurality of insulating layers 110A are alternately formed. For example, this step is performed by a method, such as Chemical Vapor Deposition (CVD).

Figure 20:
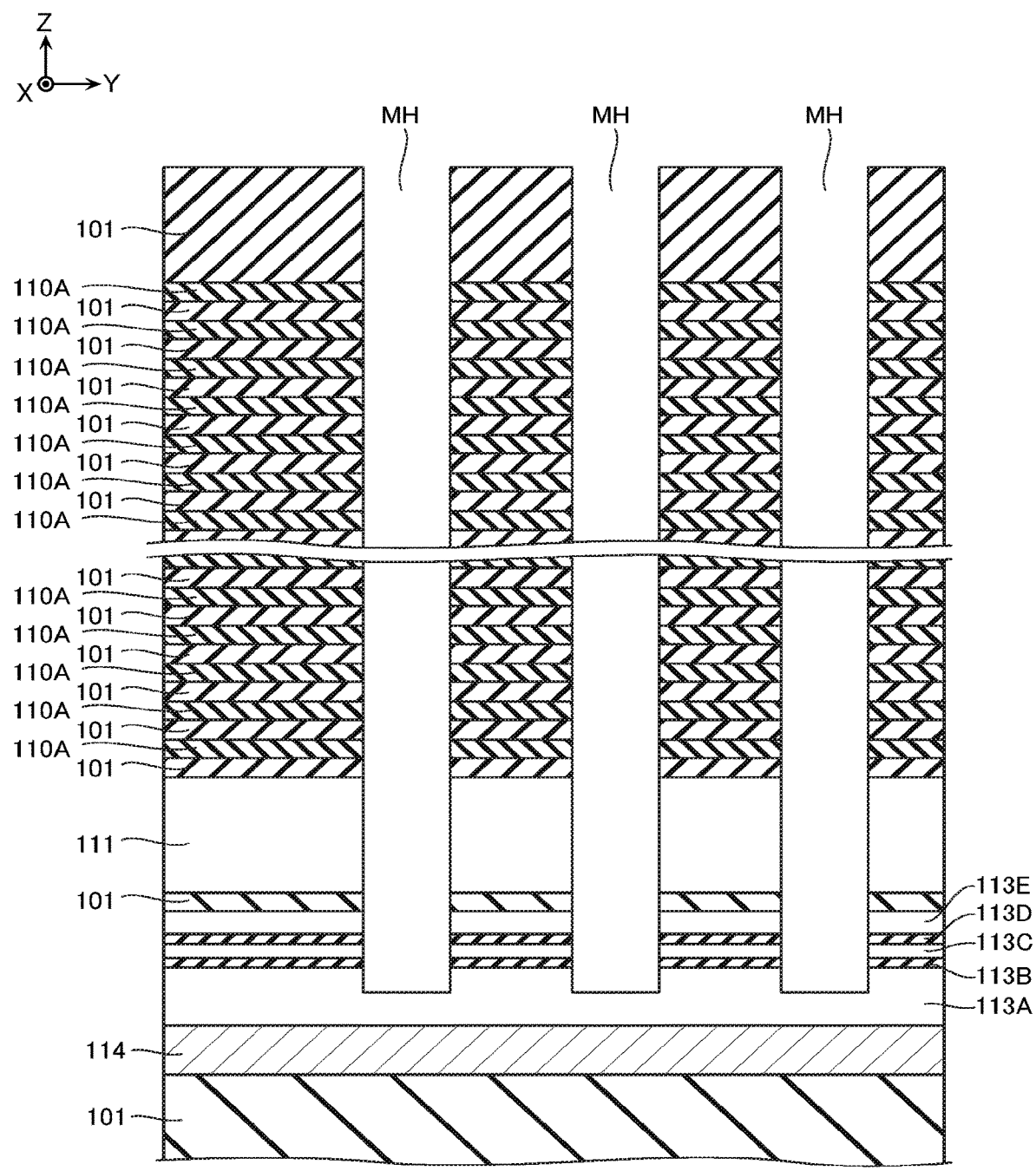
FIG. 20 is a schematic cross-sectional view illustrating the manufacturing method.

Next, for example, as illustrated in FIG. 20, a plurality of memory holes MH are formed at positions corresponding to the semiconductor layers 120. The memory hole MH is a through-hole that extends in the Z-direction, penetrates the insulating layers 101 and the insulating layers 110A, the conductive layer 111, the semiconductor layer 113E, the sacrifice layer 113D, the sacrifice layer 113C, and the sacrifice layer 113B to expose the upper surface of the semiconductor layer 113A. For example, this step is performed by a method, such as RIE.

Figure 21:
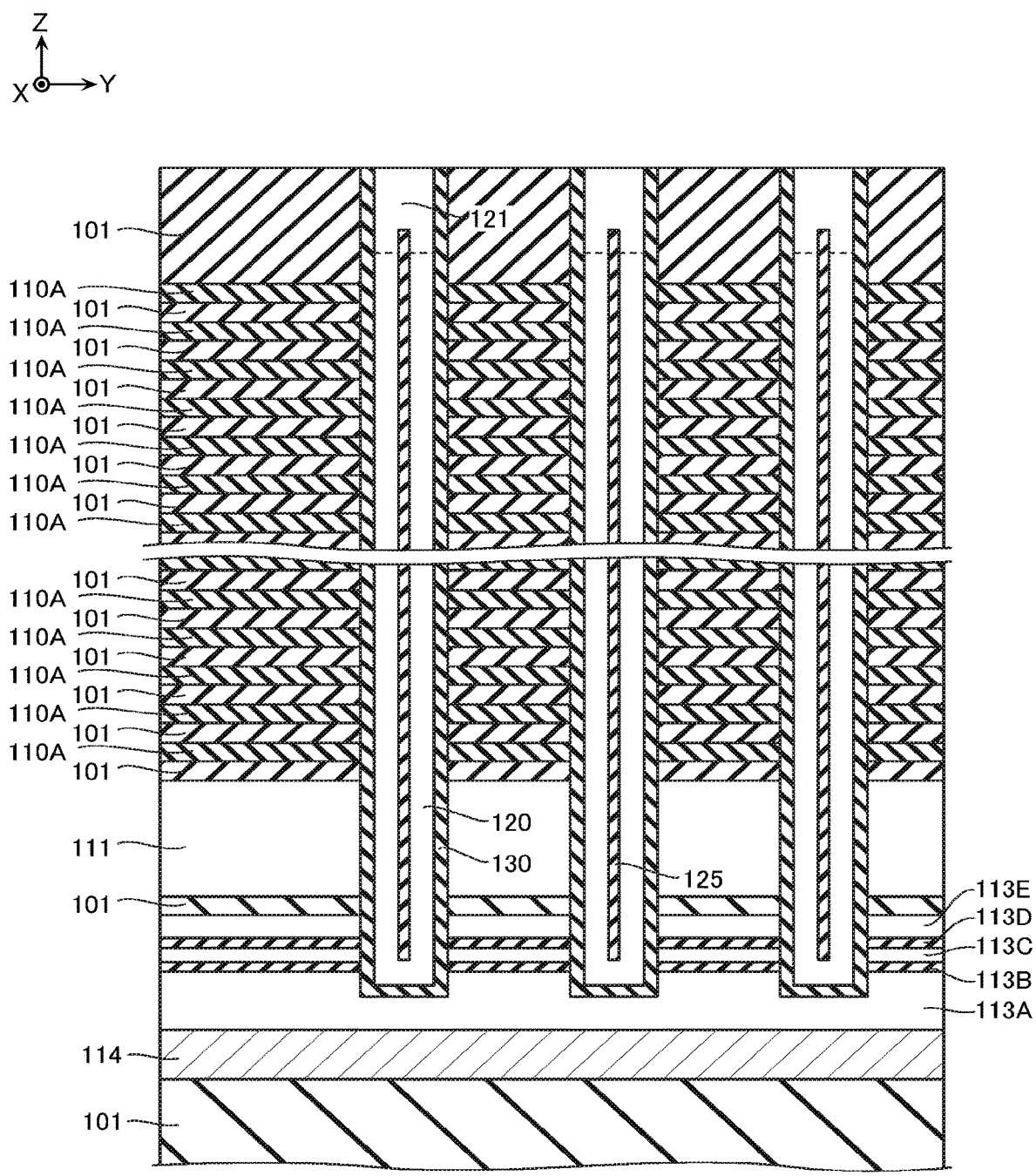
FIG. 21 is a schematic cross-sectional view illustrating the manufacturing method.

Next, for example, as illustrated in FIG. 21, the gate insulating film 130, the semiconductor layer 120, and the insulating layer 125 are formed in the inner circumferential surface of the memory hole MH. In this step, for example, a film is formed by CVD or the like, and an amorphous silicon film is formed at the inside of the memory hole MH. For example, by an annealing process or the like, a crystalline structure of this amorphous silicon film is modified.

Figure 22:
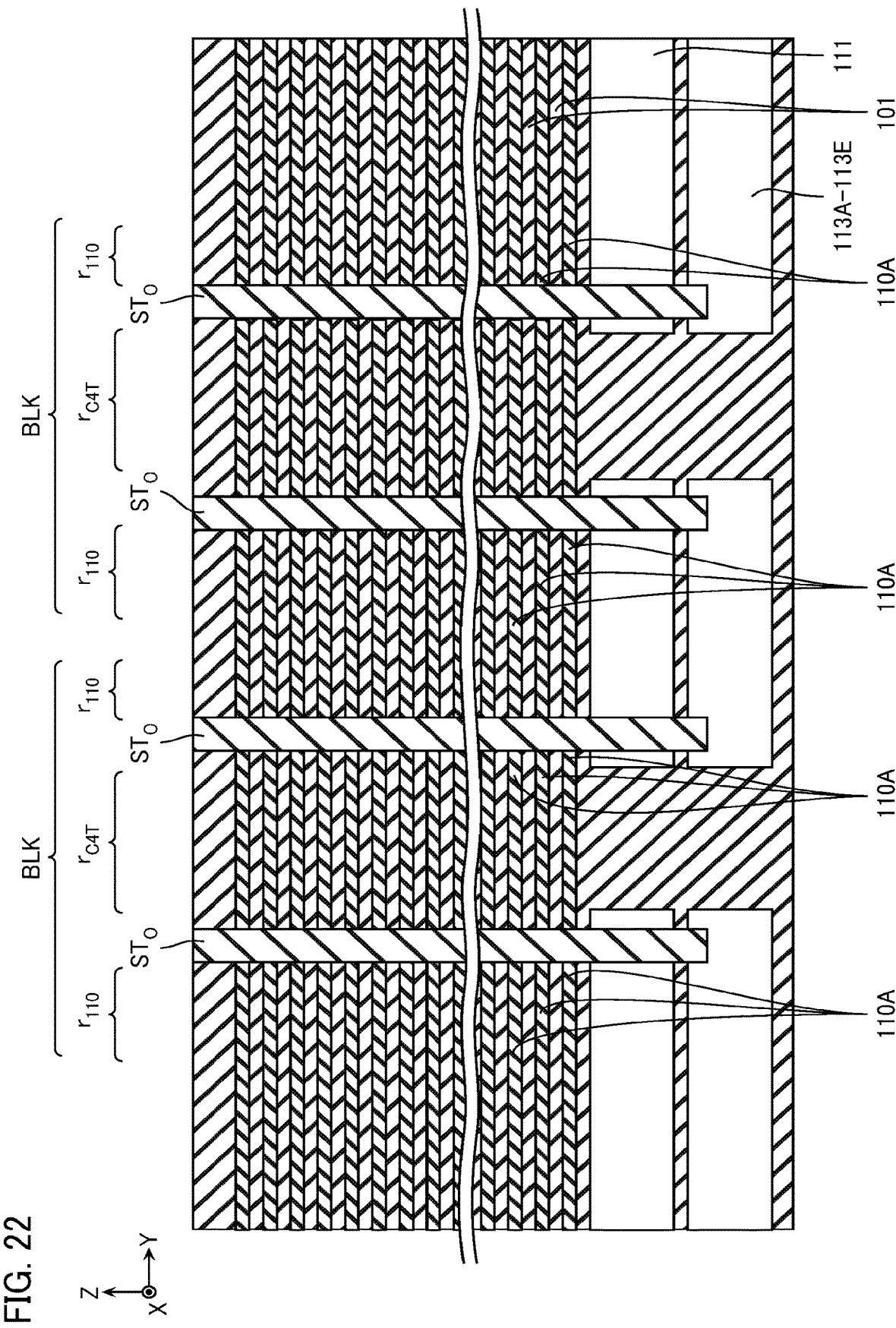
FIG. 22 is a schematic cross-sectional view illustrating the manufacturing method.

Next, for example, as illustrated in FIG. 22, the insulating layers $ST_O$ are formed. In this step, for example, by a method, such as RIE, trenches are formed at positions corresponding to the insulating layers $ST_O$. By a method, such as CVD, the insulating layer $ST_O$ is formed at the inside of this trench.

Figure 23:
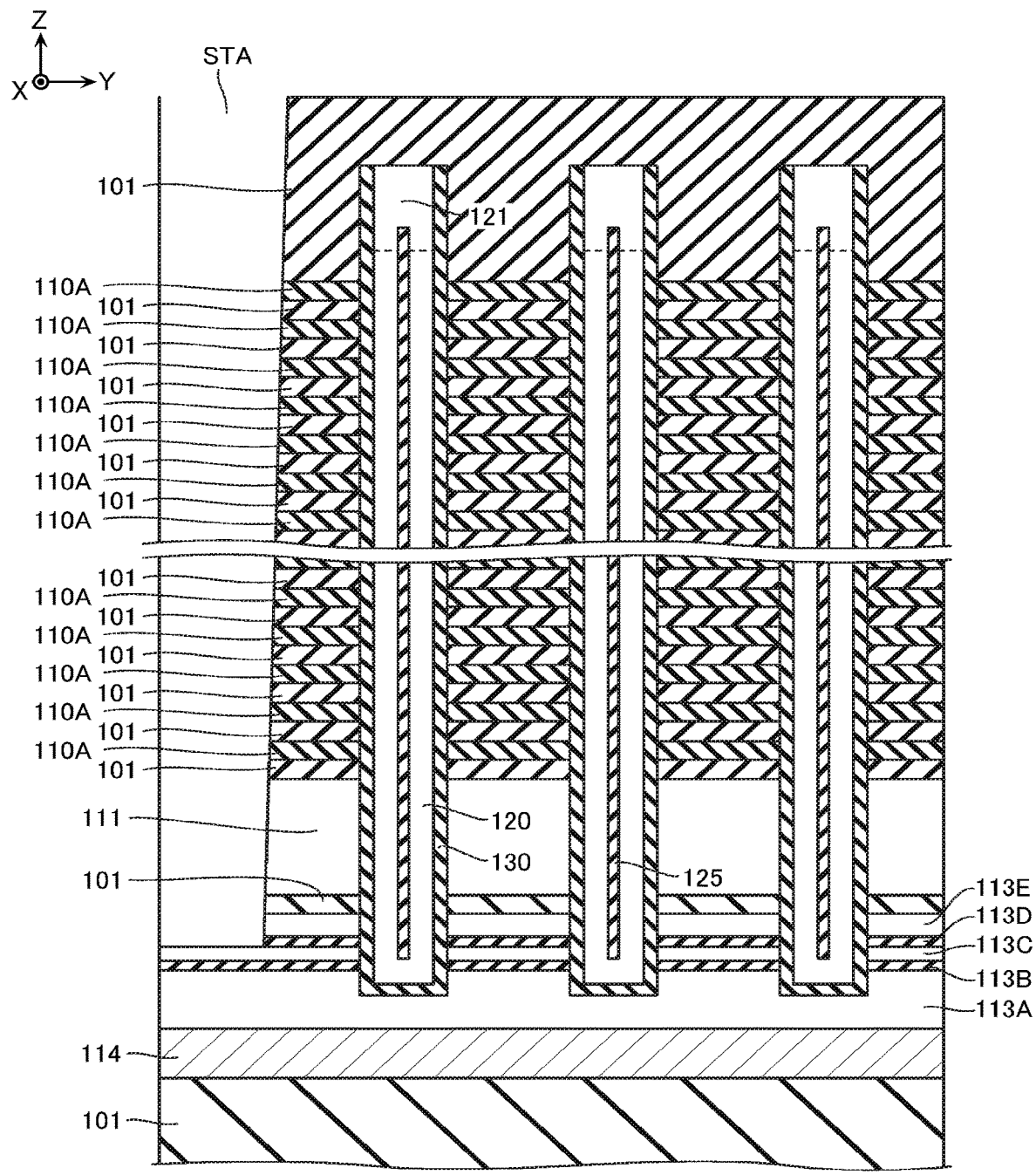
FIG. 23 is a schematic cross-sectional view illustrating the manufacturing method.
Figure 24:
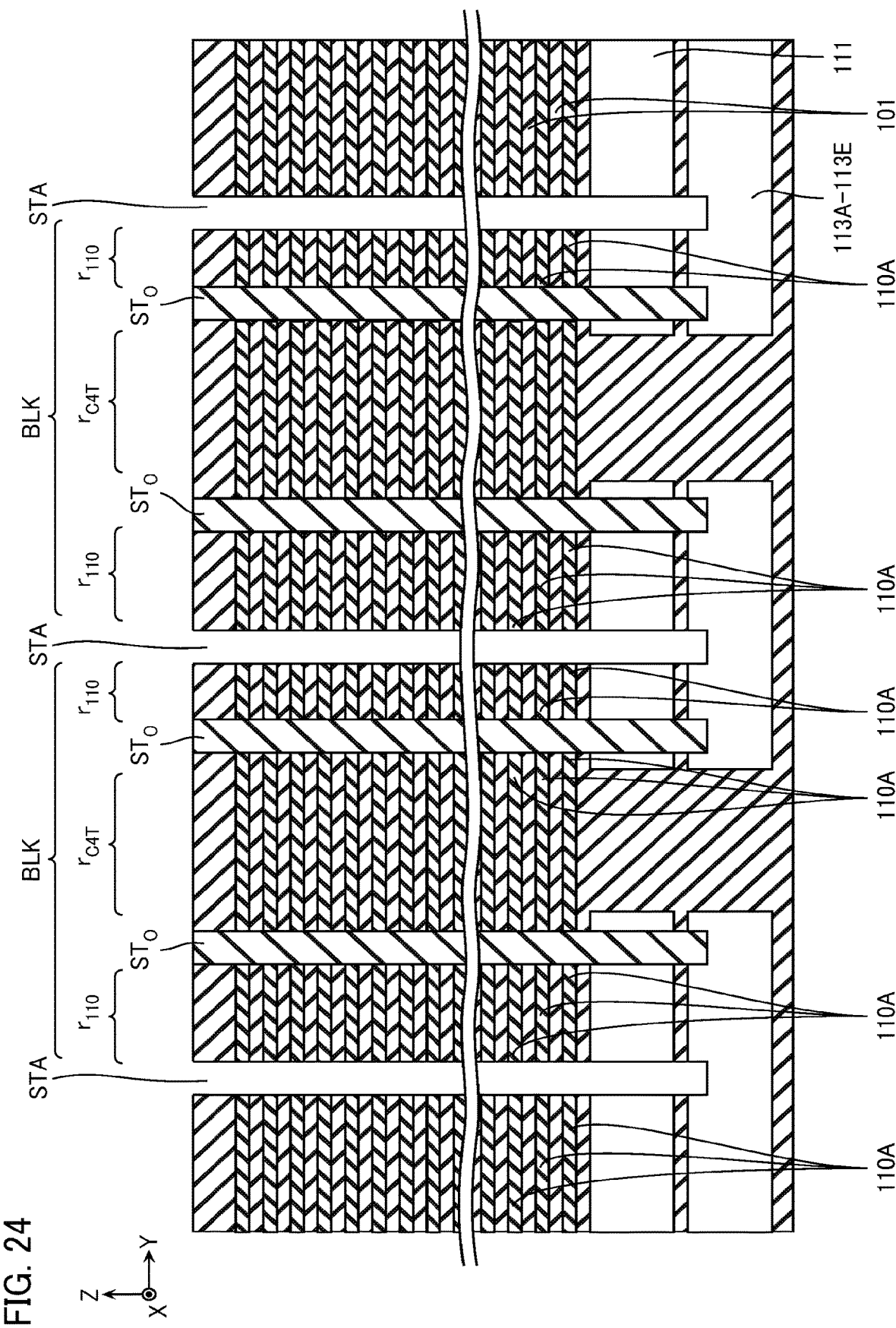
FIG. 24 is a schematic cross-sectional view illustrating the manufacturing method.

Next, for example, as illustrated in FIG. 23 and FIG. 24, a trench STA is formed. The trench STA is a trench that extends in the Z-direction and the X-direction, separates the insulating layers 101 and the insulating layers 110A, the conductive layer 111, the semiconductor layer 113E, and the sacrifice layer 113D in the Y-direction to expose the upper surface of the sacrifice layer 113C. For example, this step is performed by a method, such as RIE.

Figure 25:
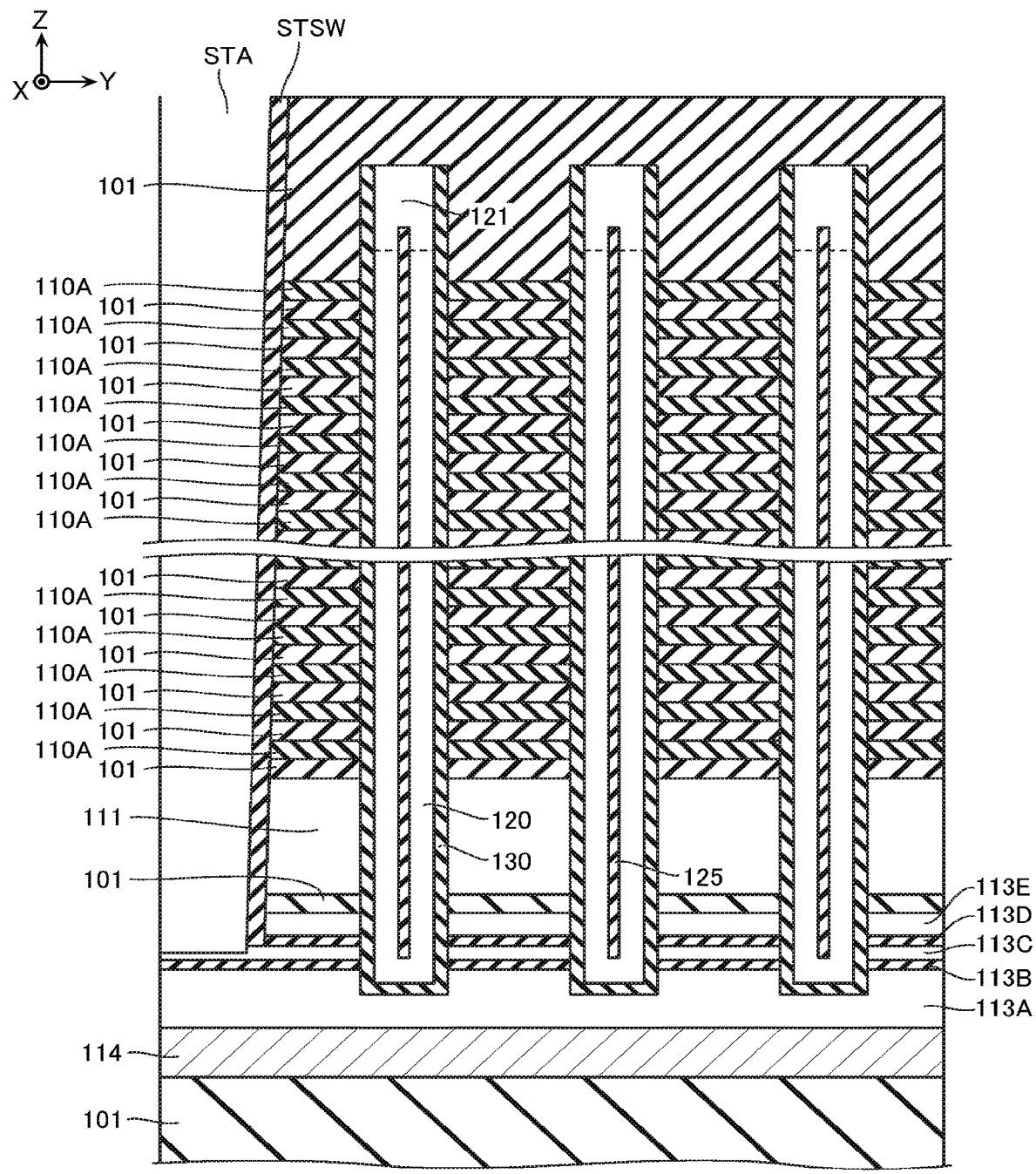
FIG. 25 is a schematic cross-sectional view illustrating the manufacturing method.

Next, for example, as illustrated in FIG. 25, a protective film STSW, such as silicon nitride, is formed on the side surface in the Y-direction of the trench STA. In this step, for example, by a method, such as CVD, insulating films, such as silicon nitride, are formed on the side surface in the Y-direction and the bottom surface of the trench STA. Additionally, by a method, such as RIE, a part of the insulating films covering the bottom surface of the trench STA is removed.

Figure 26:
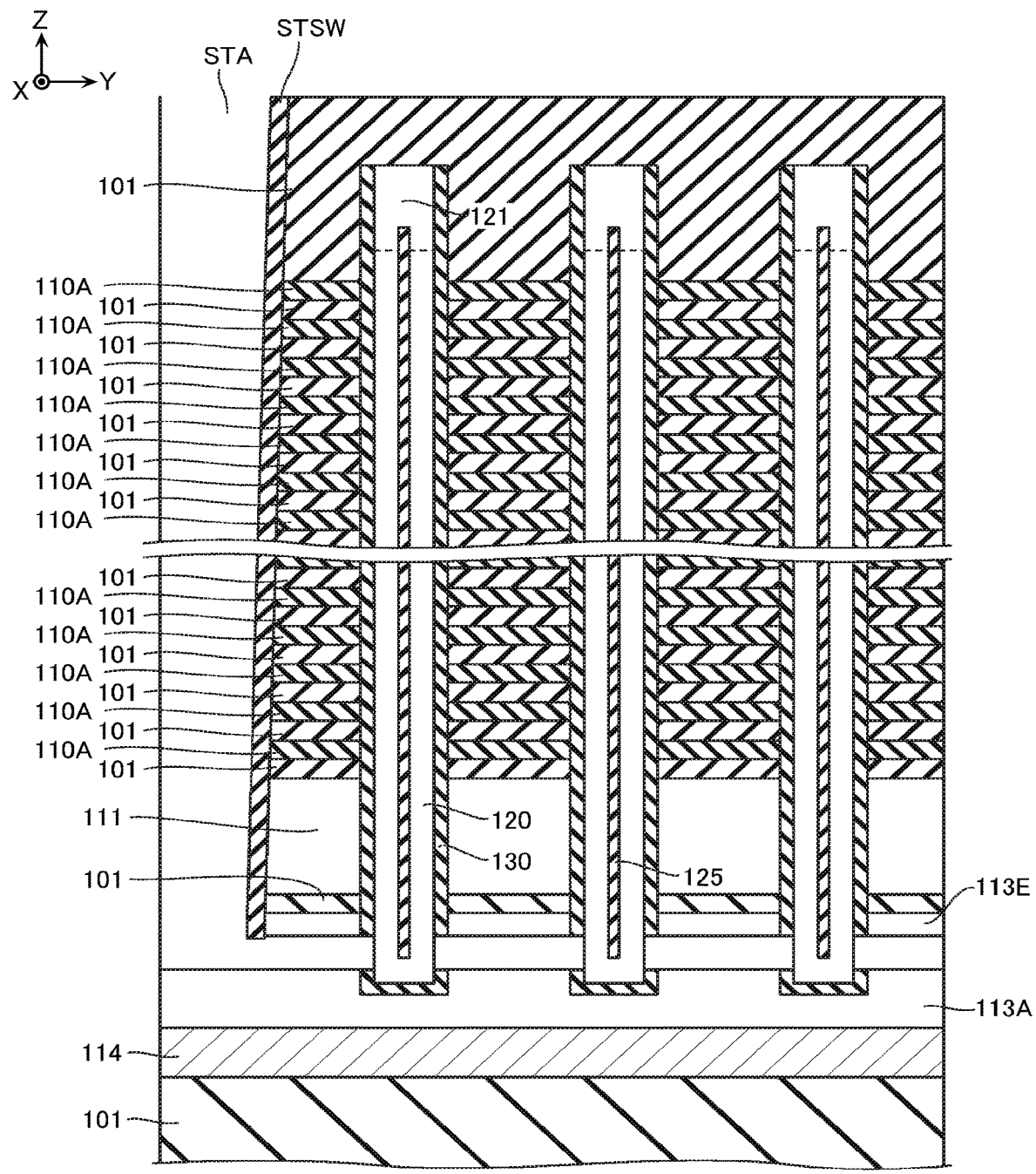
FIG. 26 is a schematic cross-sectional view illustrating the manufacturing method.

Next, for example, as illustrated in FIG. 26, a part of the sacrifice layers 113B, 113C, 113D and the gate insulating films 130 are removed to expose a part of the semiconductor layers 120. This step is performed by, for example, a method, such as wet etching.

Figure 27:
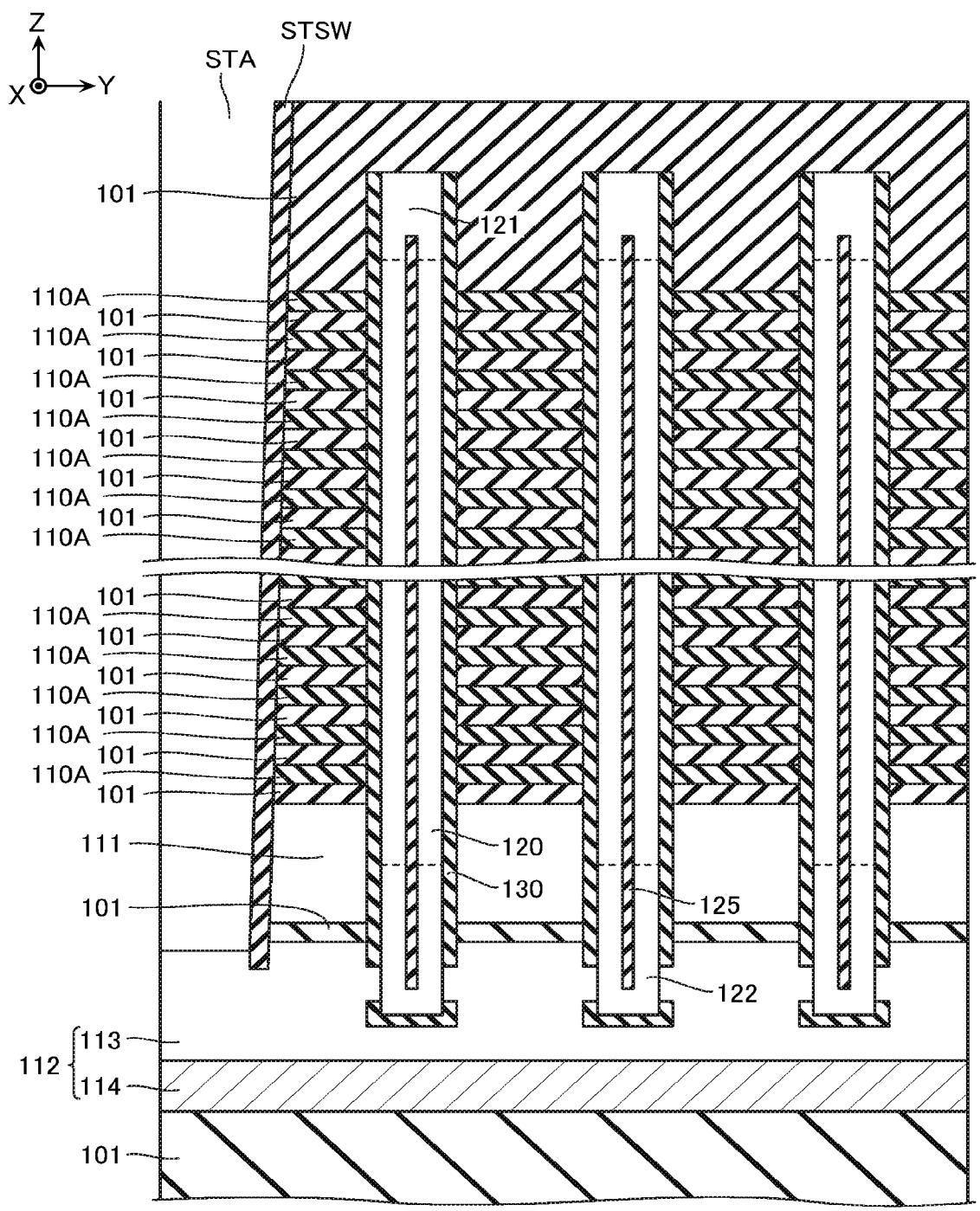
FIG. 27 is a schematic cross-sectional view illustrating the manufacturing method.

Next, for example, as illustrated in FIG. 27, the semiconductor layer 113 is formed. This step is performed by, for example, a method, such as epitaxial growth.

Figure 28:
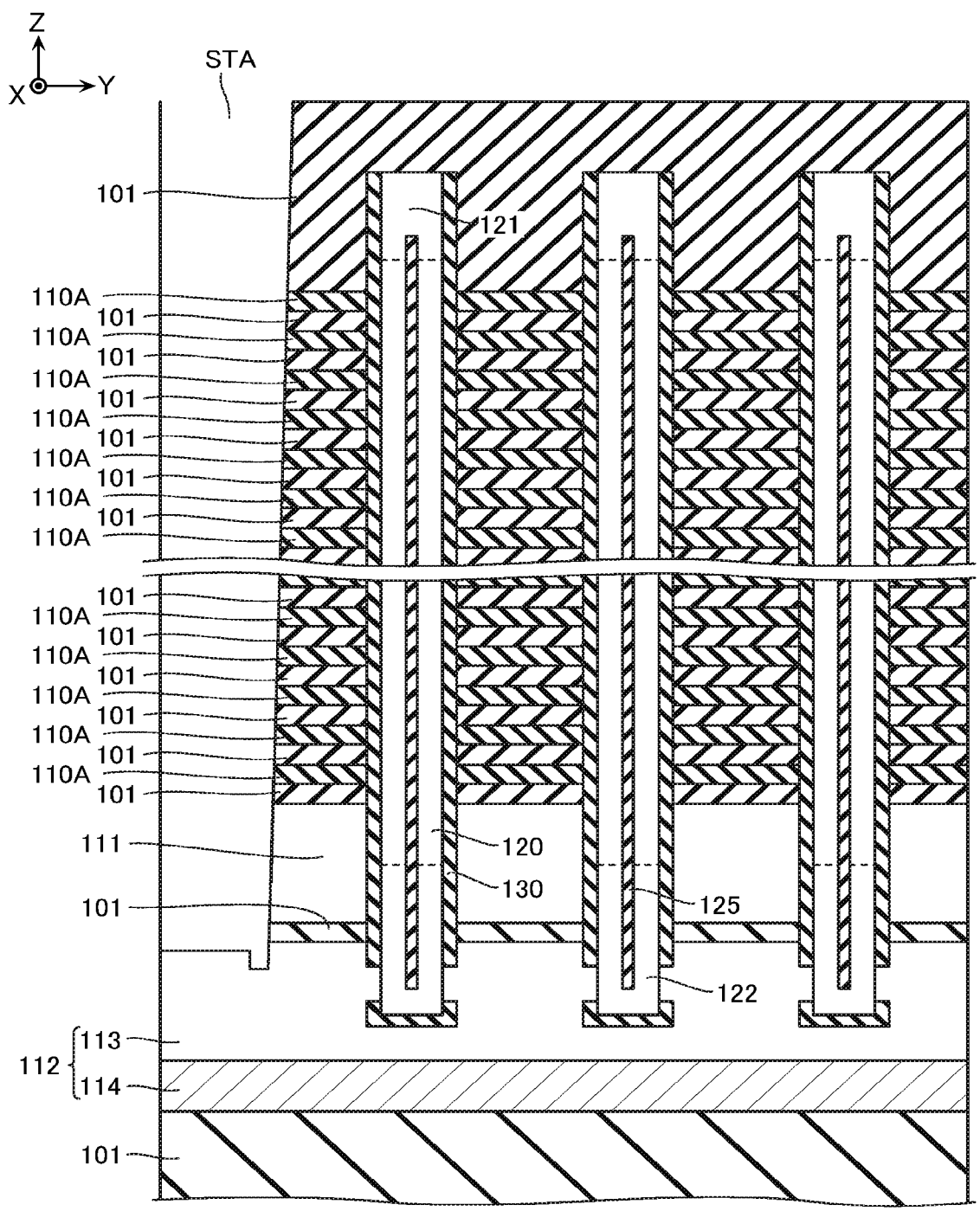
FIG. 28 is a schematic cross-sectional view illustrating the manufacturing method.

Next, for example, as illustrated in FIG. 28, the protective film STSW is removed. This step is performed by, for example, a method, such as wet etching.

Figure 29:
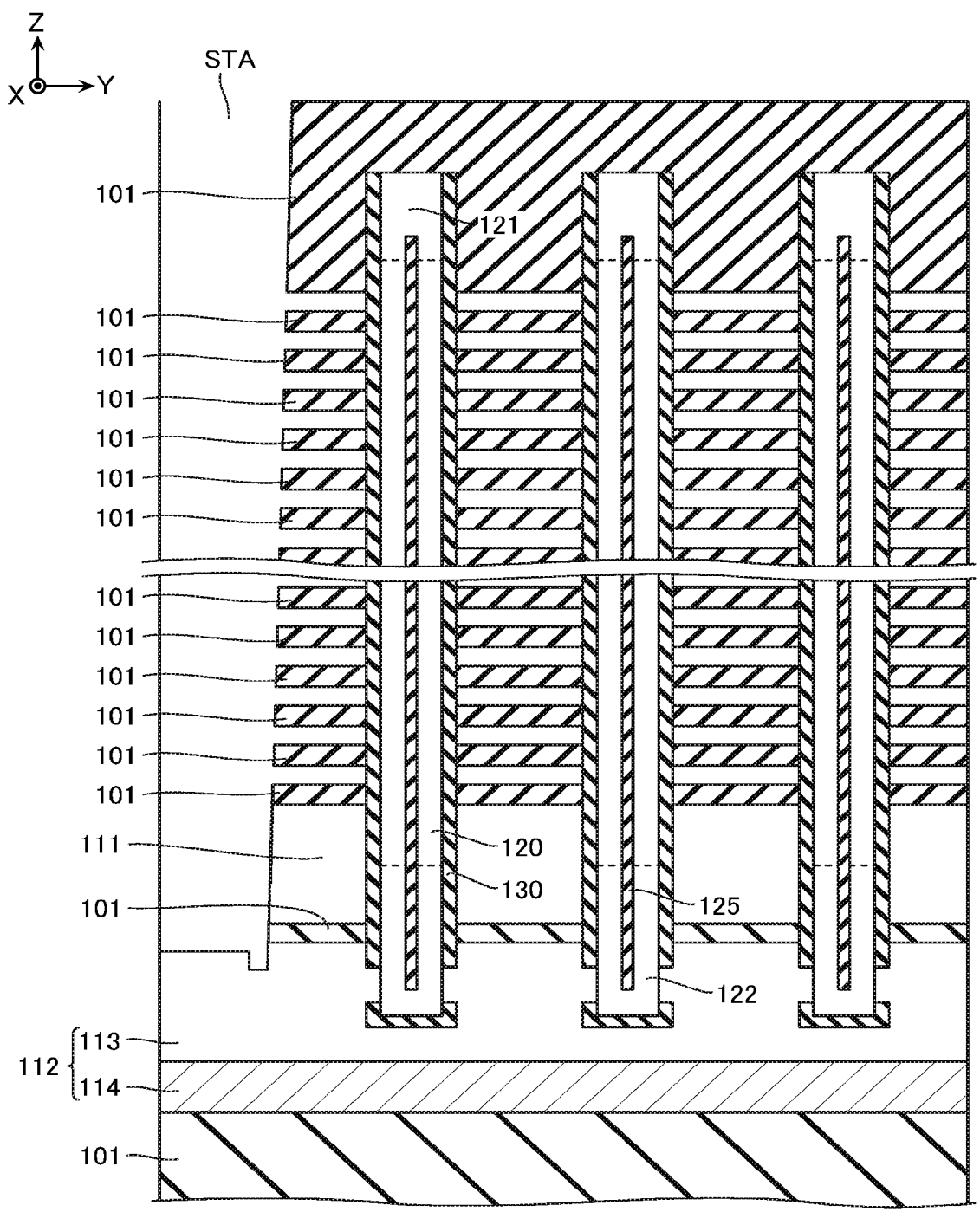
FIG. 29 is a schematic cross-sectional view illustrating the manufacturing method.
Figure 30:
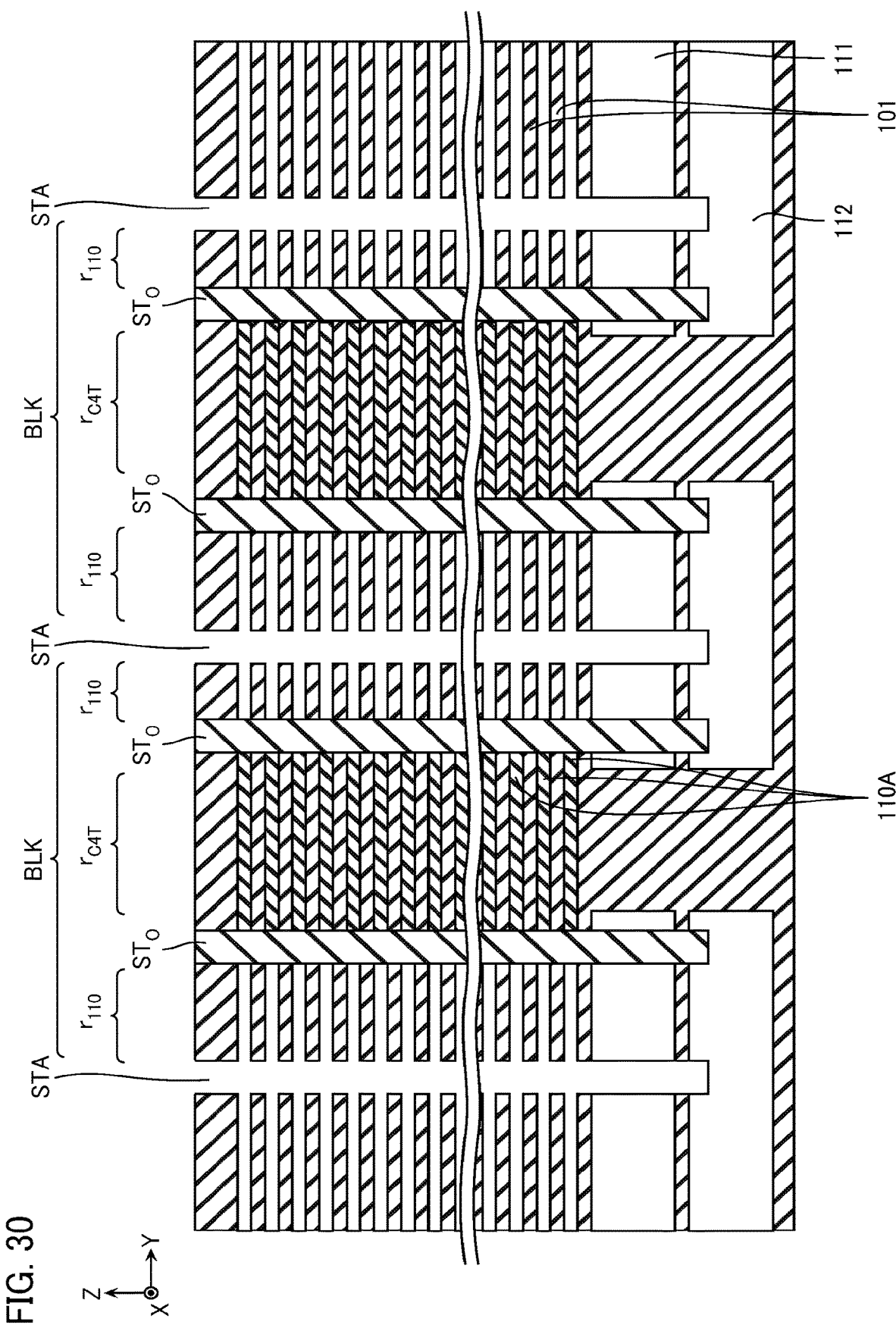
FIG. 30 is a schematic cross-sectional view illustrating the manufacturing method.

Next, for example, as illustrated in FIG. 29 and FIG. 30, the insulating layers 110A are removed via the trench STA. Thus, a hollow structure including the plurality of insulating layers 101 disposed in the Z-direction and the structures inside the memory holes MH (the semiconductor layers 120, the gate insulating films 130, and the insulating layers 125) that support the insulating layers 101 is formed. This step is performed by, for example, a method, such as wet etching. As illustrated in FIG. 30, in this step, the insulating layers 110A may remain in the contact connection sub-region $r_{C4T}$.

Figure 31:
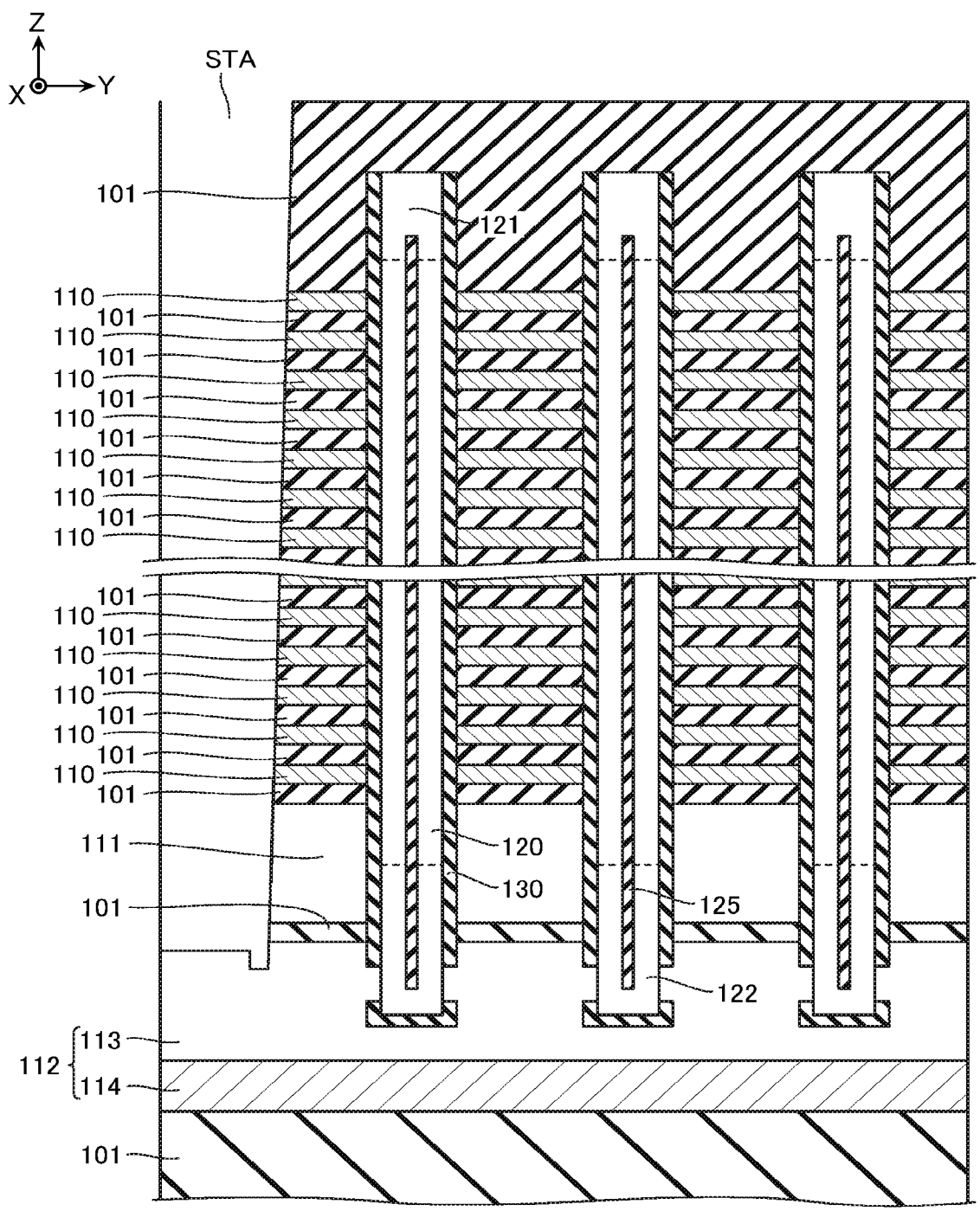
FIG. 31 is a schematic cross-sectional view illustrating the manufacturing method.
Figure 32:
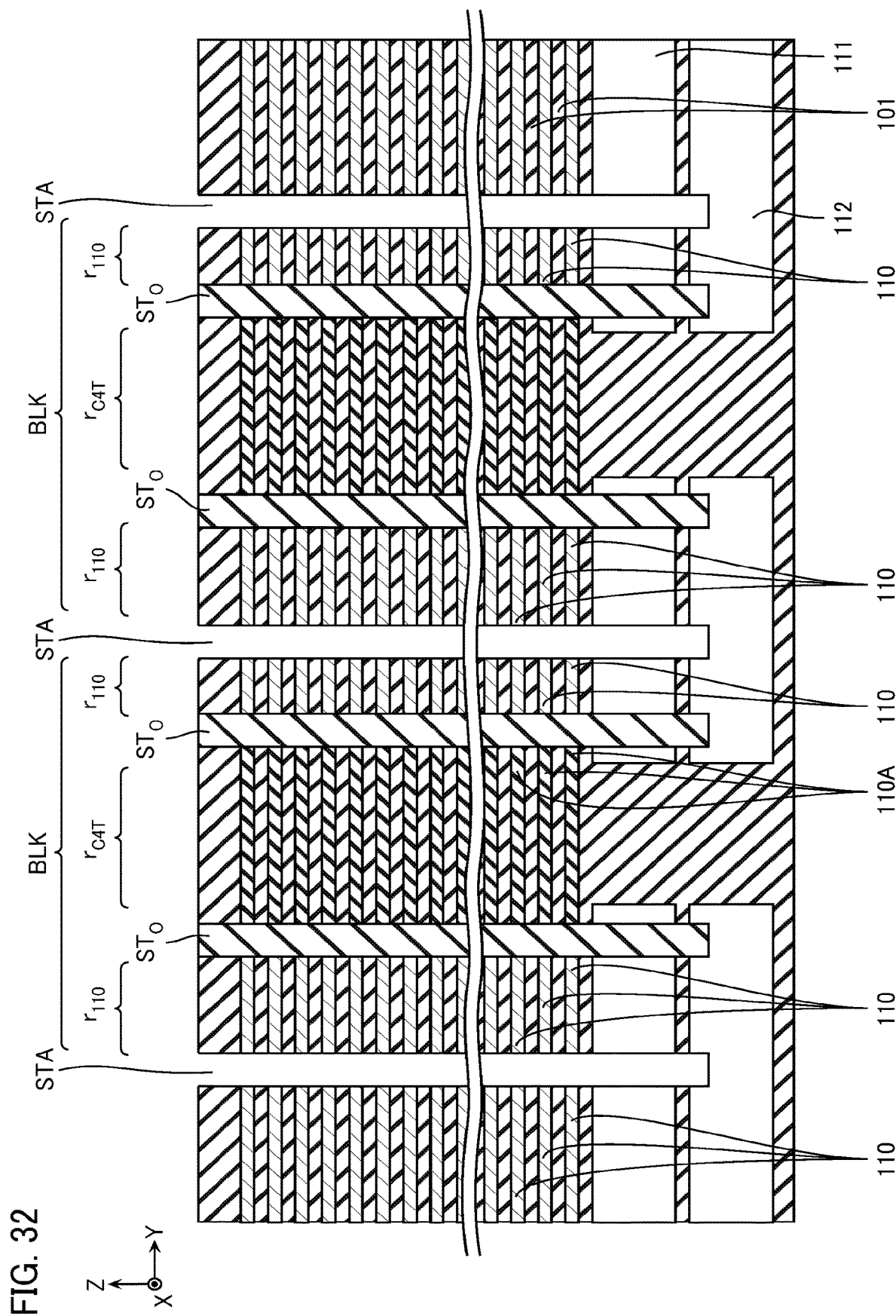
FIG. 32 is a schematic cross-sectional view illustrating the manufacturing method.

Next, for example, as illustrated in FIG. 31 and FIG. 32, the conductive layers 110 are formed. For example, this step is performed by a method, such as CVD.

Figure 33:
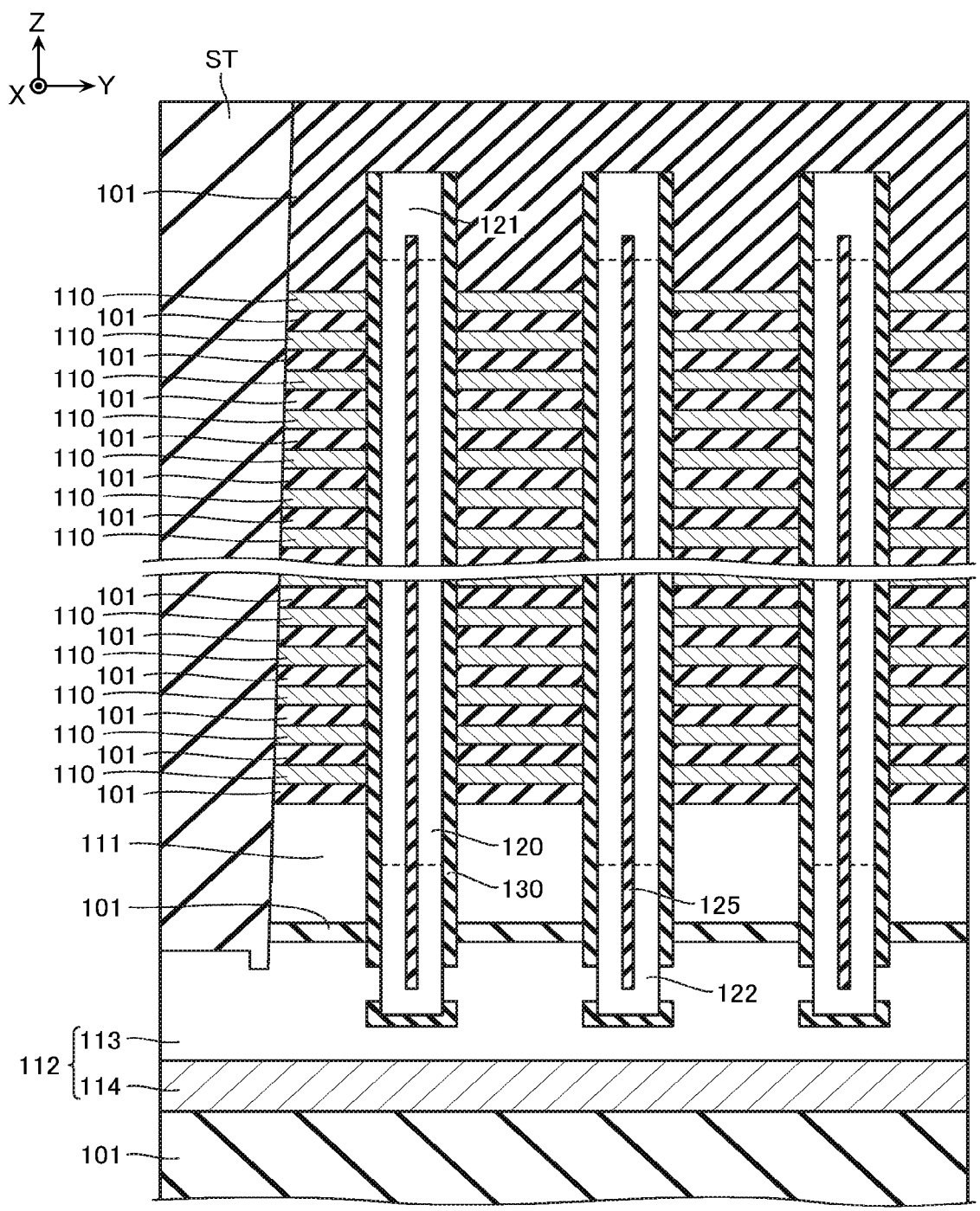
FIG. 33 is a schematic cross-sectional view illustrating the manufacturing method.
Figure 34:
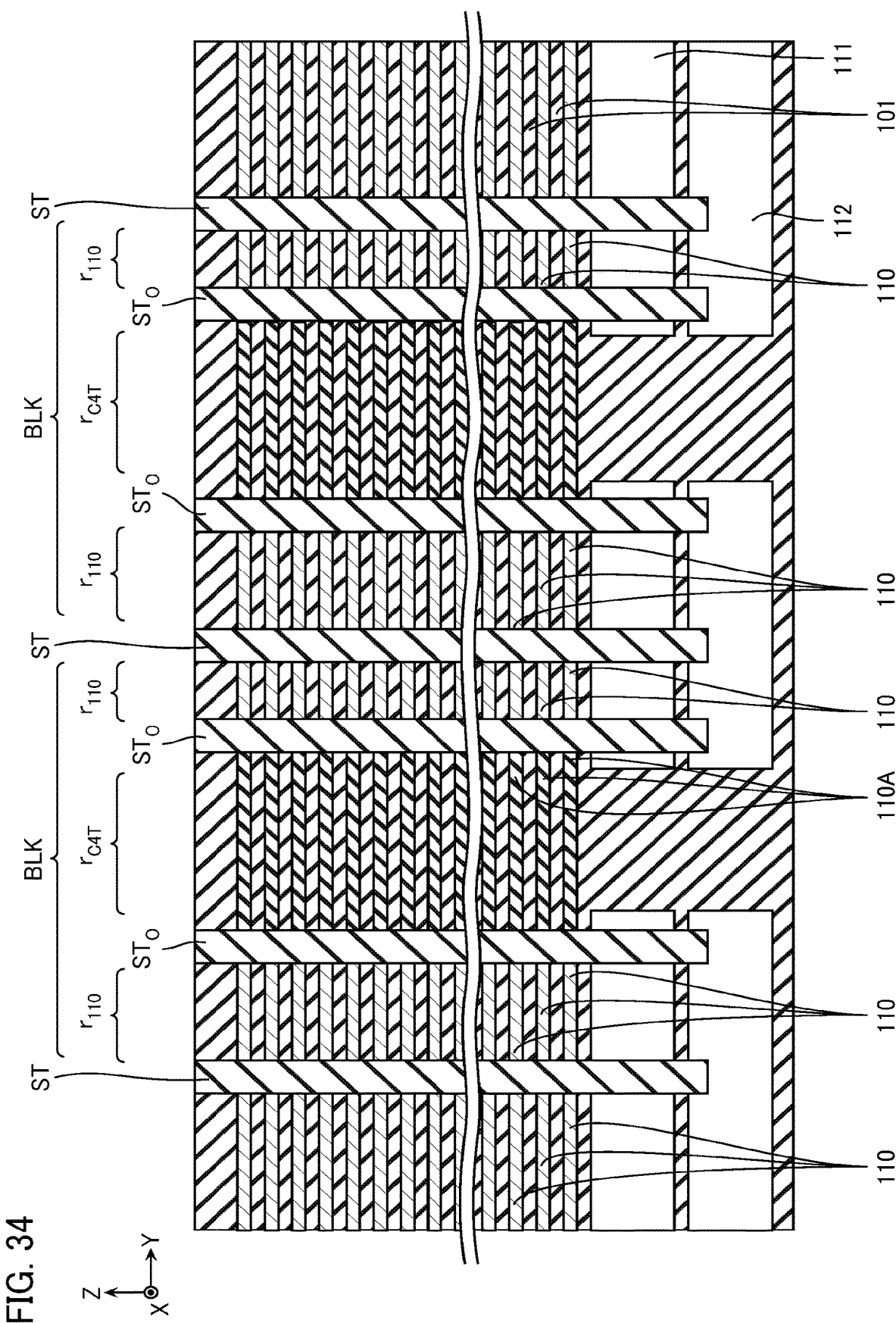
FIG. 34 is a schematic cross-sectional view illustrating the manufacturing method.

Next, for example, as illustrated in FIG. 33 and FIG. 34, the inter-block insulating layer ST is formed in the trench STA. This step is performed by, for example, a method, such as CVD and RIE.

Afterwards, wirings and the like are formed, and a wafer is separated by dicing to form the memory die MD.

[Effects]

As described above, the memory die MD according to the embodiment includes the plurality of input/output pad electrodes P(DQ). Here, data input to the memory die MD and data output from the memory die MD are performed within a range of a constant timing during the clock signal. Therefore, all of the plurality of circuits (for example, the input circuits 210, 220, the input buffer circuit 230, and the output circuits 240, 250, which have been described with reference t FIG. 6 to FIG. 8) connected to the plurality of input/output pad electrodes P(DQ) are preferably operated at the same speed.

Here, as described with reference to FIG. 9, in this embodiment, the plurality of insulating layers 110A and the plurality of insulating layers 101 are formed by a method, such as CVD. The insulating layer 110A thus formed contains hydrogen in some cases. When the heat treatment, which has been described with reference to FIG. 21, or the like is performed, there may be a case where the hydrogen is diffused.

Here, the gate electrode member 152 in the transistor $Tr_{PL}$, which has been described with reference to FIG. 18, contains the P-type impurities, such as boron (B). When the above-described hydrogen reaches the gate electrode member 152, the hydrogen reacts to the boron, and the bond between the silicon (Si) and the boron (B) in the gate electrode member 152 is broken in some cases. Additionally, this boron (B) diffuses up to the semiconductor substrate 100, and characteristics of a threshold voltage of the transistor $Tr_{PL}$ or the like vary in some cases.

To reduce the variation of the characteristics of the transistor $Tr_{PL}$, the semiconductor memory device according to the first embodiment includes the insulating layer 104 (FIG. 10) containing silicon nitride (SiN) or the like on the upper surface of the wiring layer D2. Accordingly, the diffusion of the hydrogen in the memory cell array layer $L_{MCA}$ to the transistor layer $L_{TR}$ can be substantially reduced.

However, as described above, the through contact region $R_{C4T}$ includes the region absent of the insulating layer 104 in some cases. In this case, there may be a case where the hydrogen enters the transistor layer $L_{TR}$ from this region. Additionally, there was a case where among the plurality of transistors $Tr_{PL}$ disposed in the transistor layer $L_{TR}$, the smaller the transistor $Tr_{PL}$ had a distance from the through contact region $R_{C4T}$, the larger variation the characteristics exhibited caused by hydrogen, and the larger the transistor $Tr_{PL}$ had a distance from the through contact region $R_{C4T}$, the smaller variation the characteristics exhibited caused by hydrogen. In this case, when the influence caused by the hydrogen differs between the plurality of input/output circuit regions $R_{IO}$, operating speeds possibly vary between the plurality of circuits connected to the plurality of input/output pad electrodes P(DQ).

Therefore, in the semiconductor memory device according to the first embodiment, for example, as described with reference to FIG. 16 and the like, the distance $d_{IO-C4}$, which is from the center position on the X-Y plane of the input/output circuit region $R_{IO}$ to the center position on the X-Y plane of the contact C4 closest to this input/output circuit region $R_{IO}$ in the through contact region $R_{C4T}$ closest to this input/output circuit region $R_{IO}$, is same in all of the input/output circuit regions $R_{IO}$. With this configuration, between the plurality of circuits connected to the plurality of input/output pad electrodes P(DQ), the influences caused by the hydrogen described above can be adjusted to the same extent. Accordingly, between the plurality of circuits, the variation of operating speeds can be reduced.

[Other Embodiments]

The semiconductor memory device according to the first embodiment has been described above with reference to FIG. 1 to FIG. 34. However, the configuration is merely an example, and the specific configuration or the like is appropriately adjustable.

For example, as described with reference to FIG. 16, in the first embodiment, one input/output pad electrode P(DQ) and the input/output circuit region $R_{IO}$ corresponding to the input/output pad electrode P(DQ) are disposed at the position corresponding to a position between the two through contact regions $R_{C4T}$ adjacent in the X-direction. However, the configuration is merely an example, and the specific configuration or the like is appropriately adjustable. For example, as illustrated in FIG. 35, between the two through contact regions $R_{C4T}$ adjacent in the X-direction, the two input/output pad electrodes P(DQ) arranged in the X-direction may be disposed.

Figure 35:
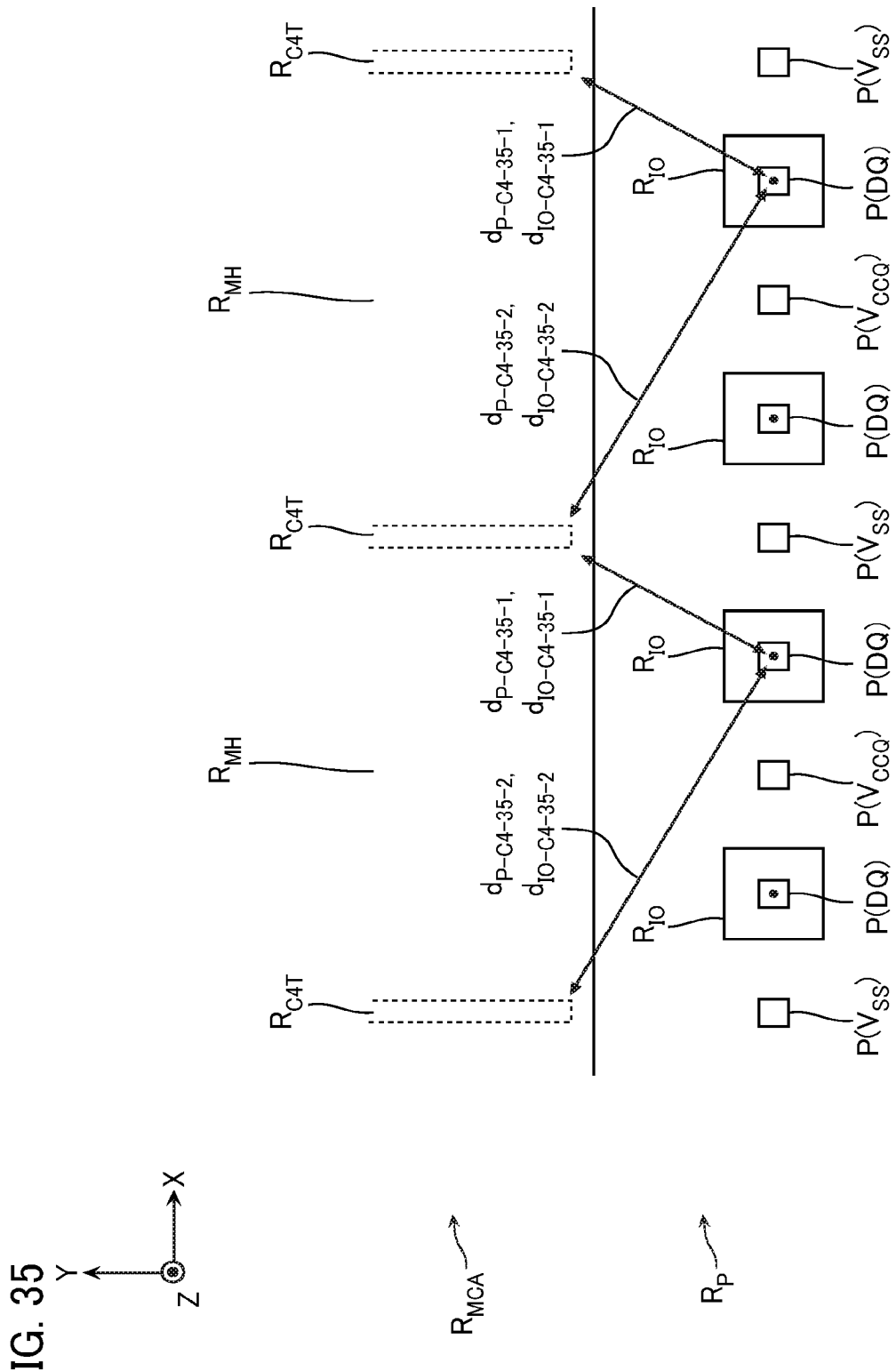
FIG. 35 is a schematic plan view illustrating a configuration of a part of a memory die according to another embodiment.

Note that, in the example of FIG. 35, when a distance from the center position on the X-Y plane of the input/output pad electrode P(DQ) to the center position on the X-Y plane of the contact C4 closest to this input/output pad electrode P(DQ) in the through contact region $R_{C4T}$ closest to this input/output pad electrode P(DQ) is defined as a distance $d_{P-C4-35-1}$, the distances $d_{P-C4-35-1}$ of all of the input/output pad electrodes P(DQ) are the same. In the example of FIG. 35, when a distance from the center position on the X-Y plane of the input/output pad electrode P(DQ) to the center position on the X-Y plane of the contact C4 closest to this input/output pad electrode P(DQ) in the through contact region $R_{C4T}$ second closest to this input/output pad electrode P(DQ) is defined as a distance $d_{P-C4-35-2}$, the distances $d_{P-C4-35-2}$ of all of the input/output pad electrodes P(DQ) are the same.

All of the distances $d_{P-C4-35-1}$, $d_{P-C4-35-2}$ corresponding to all of the input/output pad electrodes P(DQ) are preferably the same. However, there is a case where the distances $d_{P-C4-35-1}$, $d_{P-C4-35-2}$ are not completely matched due to a convenience of design, a manufacturing error, or the like. In such a case, for example, a difference between the maximum value and the minimum value of the distances $d_{P-C4-35-1}$, $d_{P-C4-35-2}$ is preferably 400 nm or less.

In the example of FIG. 35, when the shortest distance from the center position on the X-Y plane of the input/output circuit region $R_{IO}$ to the center position on the X-Y plane of the contact C4 closest to this input/output circuit region $R_{IO}$ in the through contact region $R_{C4T}$ closest to this input/output circuit region $R_{IO}$ is defined as a distance $d_{IO-C4-35-1}$, the distances $d_{IO-C4-35-1}$ of all of the input/output circuit regions $R_{IO}$ are the same. In the example of FIG. 35, when the shortest distance from the center position on the X-Y plane of the input/output circuit region $R_{IO}$ to the center position on the X-Y plane of the contact C4 closest to this input/output circuit region $R_{IO}$ in the through contact region $R_{C4T}$ second closest to this input/output circuit region $R_{IO}$ is defined as a distance $d_{IO-C4-35-2}$, the distances $d_{IO-C4-35-2}$ of all of the input/output circuit regions $R_{IO}$ are the same.

Note that all of the distances $d_{IO-C4-35-1}$, $d_{IO-C4-35-2}$ corresponding to all of the input/output circuit regions $R_{IO}$ are preferably the same. However, there is a case where the distances $d_{IO-C4-35-1}$, $d_{IO-C4-35-2}$ are not completely matched due to a convenience of design, a manufacturing error, or the like. In such a case, for example, a difference between the maximum value and the minimum value of the distance $d_{IO-C4-35-1}$, $d_{IO-C4-35-2}$ is preferably 400 nm or less.

When the arrangement as in FIG. 35 is employed, it is possible to dispose the transistors Tr and the like in the even-numbered input/output circuit regions $R_{IO}$ counted in the X-direction and dispose the transistors Tr and the like in the odd-numbered input/output circuit regions $R_{IO}$ counted in the X-direction in a symmetrical pattern having the Y-direction as the axis (a symmetrical pattern in the example of FIG. 35). With this arrangement, even when the concentration of the hydrogen varies in the input/output circuit regions $R_{IO}$, the influence from the hydrogen as described above can be adjusted to the same extent between the plurality of circuits connected to the plurality of input/output pad electrodes P(DQ).

For example, as described with reference to FIG. 16, in the first embodiment, the center positions of the plurality of input/output pad electrodes P(DQ) and the input/output circuit regions $R_{IO}$ corresponding to the input/output pad electrodes P(DQ) in the X-direction are matched with the respective intermediate positions in the X-direction of the two through contact regions $R_{C4T}$ adjacent in the X-direction. However, the configuration is merely an example, and the specific configuration or the like is appropriately adjustable. For example, as illustrated in FIG. 36, the respective center positions of the plurality of input/output pad electrodes P(DQ) and the input/output circuit regions $R_{IO}$ corresponding to the input/output pad electrodes P(DQ) in the X-direction need not to be matched with the intermediate positions in the X-direction of the two through contact regions $R_{C4T}$ adjacent in the X-direction.

Figure 36:
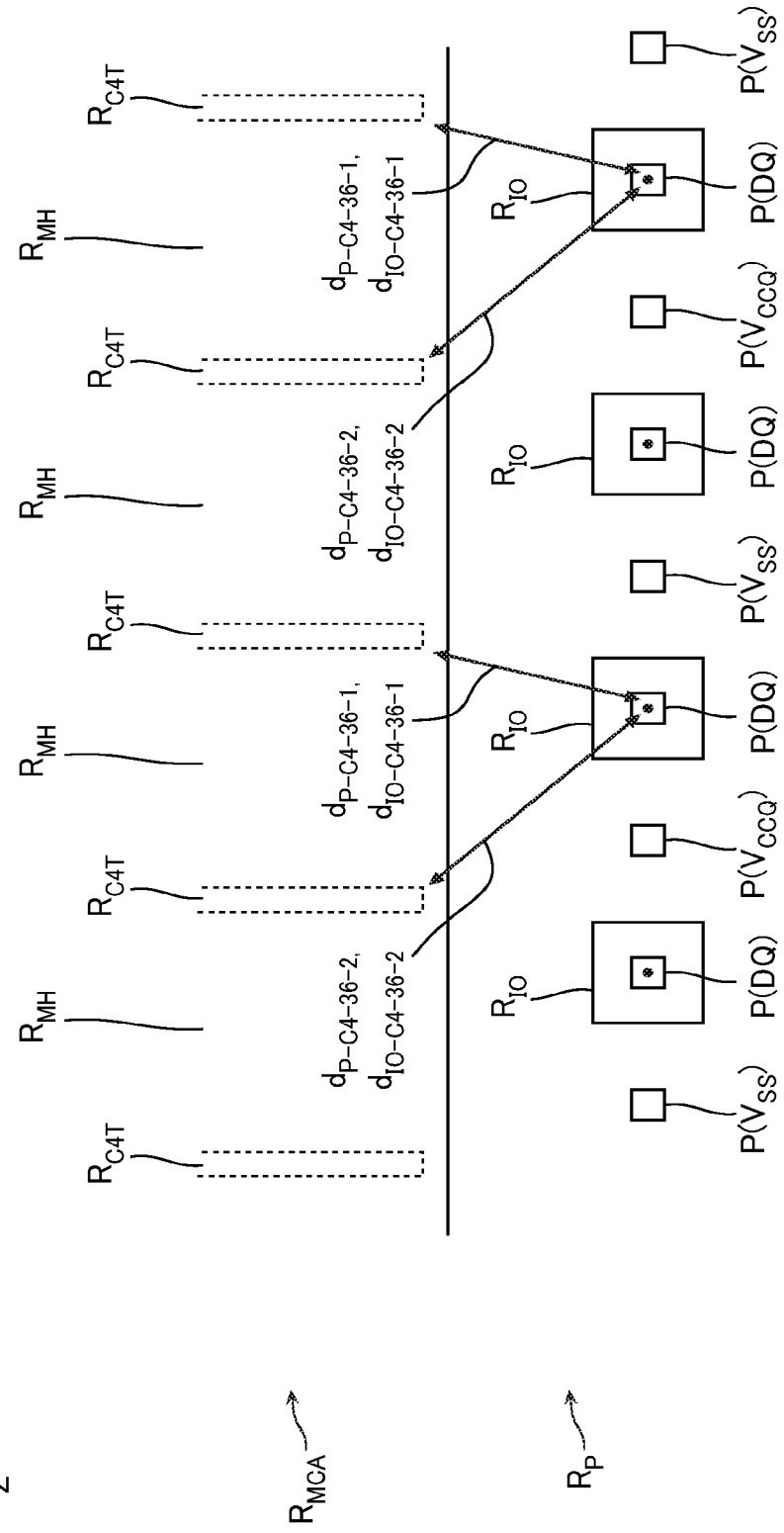
FIG. 36 is a schematic plan view illustrating a configuration of a part of a memory die according to another embodiment.

Note that, in the example of FIG. 36, when a distance from the center position on the X-Y plane of the input/output pad electrode P(DQ) to the center position on the X-Y plane of the contact C4 closest to this input/output pad electrode P(DQ) in the through contact region $R_{C4T}$ closest to this input/output pad electrode P(DQ) is defined as a distance $d_{P-C4-36-1}$, the distances $d_{P-C4-36-1}$ of all of the input/output pad electrodes P(DQ) are same. In the example of FIG. 36, when a distance from the center position on the X-Y plane of the input/output pad electrode P(DQ) to the center position on the X-Y plane of the contact C4 closest to this input/output pad electrode P(DQ) in the through contact region $R_{C4T}$ second closest to this input/output pad electrode P(DQ) is defined as a distance $d_{P-C4-36-2}$, the distances $d_{P-C4-36-2}$ of all of the input/output pad electrodes P(DQ) are same.

All of the distances $d_{P-C4-36-1}$, $d_{P-C4-36-2}$ corresponding to all of the input/output pad electrodes P(DQ) are preferably the same. However, there is a case where the distances $d_{P-C4-36-1}$, $d_{P-C4-36-2}$ are not completely matched due to a convenience of design, a manufacturing error, or the like. In such a case, for example, a difference between the maximum value and the minimum value of the distances $d_{P-C4-36-1}$, $d_{P-C4-36-2}$ is preferably 400 nm or less.

In the example of FIG. 36, when the distance from the center position on the X-Y plane of the input/output circuit region $R_{IO}$ to the center position on the X-Y plane of the contact C4 closest to this input/output circuit region $R_{IO}$ in the through contact region $R_{C4T}$ closest to this input/output circuit region $R_{IO}$ is defined as a distance $d_{IO-C4-36-1}$, the distances $d_{IO-C4-36-1}$ of all of the input/output circuit regions $R_{IO}$ are same. In the example of FIG. 36, when a distance from the center position on the X-Y plane of the input/output circuit region $R_{IO}$ to the center position on the X-Y plane of the contact C4 closest to this input/output circuit region $R_{IO}$ in the through contact region $R_{C4T}$ second closest to this input/output circuit region $R_{IO}$ is defined as a distance $d_{IO-C4-36-2}$, the distances $d_{IO-C4-36-2}$ of all of the input/output circuit regions $R_{IO}$ are same.

Note that all of the distances $d_{IO-C4-36-1}$, $d_{IO-C4-36-2}$ corresponding to all of the input/output circuit regions $R_{IO}$ are preferably the same. However, there is a case where the distances $d_{IO-C4-36-1}$, $d_{IO-C4-36-2}$ are not completely matched due to a convenience of design, a manufacturing error, or the like. In such a case, for example, a difference between the maximum value and the minimum value of the distance $d_{IO-C4-36-1}$, $d_{IO-C4-36-2}$ is preferably 400 nm or less.

When the arrangement as in FIG. 36 is employed, it is possible to dispose the transistors Tr and the like in the same pattern in all of the input/output circuit regions $R_{IO}$. With this arrangement, even when the concentration of the hydrogen varies in the input/output circuit regions $R_{IO}$, the influence from the hydrogen as described above can be adjusted to the same extent between the plurality of circuits connected to the plurality of input/output pad electrodes P(DQ).

In FIG. 16, FIG. 35, and FIG. 36, the center positions on the X-Y planes of the input/output pad electrodes P(DQ) are matched with the center positions on the X-Y planes of the input/output circuit regions $R_{IO}$. However, the configuration is merely an example, and the specific configuration or the like is appropriately adjustable. For example, the center position on the X-Y plane of the input/output pad electrode P(DQ) needs not to be matched with the center position on the X-Y plane of the input/output circuit region $R_{IO}$.

[Transistor Tr]

Figure 37:
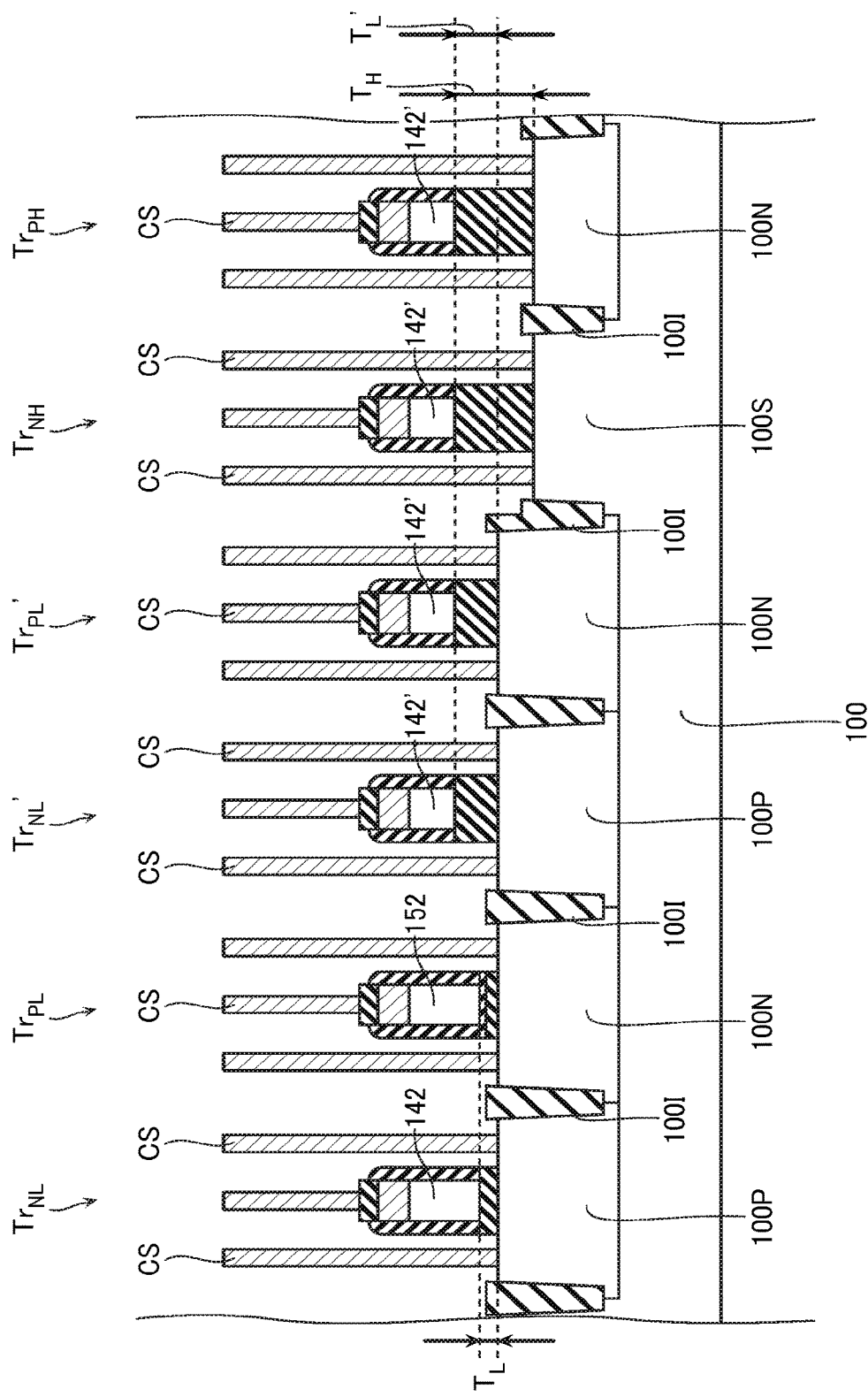
FIG. 37 is a schematic cross-sectional view describing the memory die MD according to the first embodiment and types of transistors mountable to the memory die according to another embodiment.

As described above, in the transistor layer $L_{TR}$ of the memory die MD, the high-voltage transistors and the low-voltage transistors are disposed. Hereinafter, this point is described in more detail with reference to FIG. 37. FIG. 37 is a schematic cross-sectional view describing the memory die MD according to the first embodiment and types of the transistors mountable to the memory die according to another embodiment.

FIG. 37 illustrates the above-described transistor $Tr_{NL}$ and a transistor $Tr_{NL'}$ as N-type low-voltage transistors. Additionally, FIG. 37 illustrates the above-described transistor $Tr_{PL}$ and a transistor $Tr_{PL'}$ as P-type low-voltage transistors. FIG. 37 illustrates a transistor $Tr_{NH}$ as an N-type high-voltage transistor. FIG. 37 illustrates a transistor $Tr_{PH}$ as a P-type high-voltage transistor.

The transistors $Tr_{NL}$, $Tr_{PL}$ operate at higher speeds than those of the transistors $Tr_{NL'}$, $Tr_{PL'}$, $Tr_{NH}$, $Tr_{PH}$. Therefore, the transistors $Tr_{NL}$, $Tr_{PL}$ are used for a part where an operation where the highest speed is required in the peripheral circuit PC. For example, as described above, the transistors $Tr_{NL}$, $Tr_{PL}$ are included in the input/output control circuit I/O (FIG. 4).

The transistors $Tr_{NL'}$, $Tr_{PL'}$ have withstand voltages larger than those of the transistors $Tr_{NL}$, $Tr_{PL}$. Additionally, the transistors $Tr_{NL'}$, $Tr_{PL'}$ operate at higher speeds than those of the transistors $Tr_{NH}$, $Tr_{PH}$. The transistors $Tr_{NL}$, $Tr_{PL}$ are used for a part that transfers a signal, performs an operation, performs decoding, and the like in the peripheral circuit PC. For example, the transistors $Tr_{NL'}$, $Tr_{PL'}$ are included in the sense amplifier module SAM, the sequencer SQC, the cache memory CM, the address register ADR, the command register CMR, the status register STR (FIG. 4), and the like.

The transistors $Tr_{NH}$, $Tr_{PH}$ have withstand voltages larger than those of the transistors $Tr_{NL}$, $Tr_{PL}$, $Tr_{NL'}$, $Tr_{PL'}$. The transistors $Tr_{NL}$, $Tr_{PL}$ are used for a part that generates a voltage, transfers a voltage, and the like in the peripheral circuit PC. For example, the transistors $Tr_{NH}$, $Tr_{PH}$ are included in the voltage generation circuit VG, the row decoder RD (FIG. 4), and the like.

For example, as described above, the transistor $T_{rNL}$ uses the P-type well region 100P in the semiconductor substrate 100 as the channel region. For example, as described above, the transistor $Tr_{PL}$ uses the N-type well region 100N in the semiconductor substrate 100 as the channel region. The transistor $Tr_{NL'}$, for example, uses the P-type well region 100P in the semiconductor substrate 100 as the channel region. The transistor $Tr_{PL'}$, for example, uses the N-type well region 100N in the semiconductor substrate 100 as the channel region. The transistor $Tr_{NH}$, for example, uses the semiconductor substrate region 100S in the semiconductor substrate 100 as the channel region. The transistor $Tr_{PH}$, for example, uses the N-type well region 100N in the semiconductor substrate 100 as the channel region.

As described above, the gate electrode of the transistor $Tr_{NL}$ includes the gate electrode member 142, such as polycrystalline silicon (Si), containing the N-type impurities. As described above, the gate electrode of the transistor $Tr_{PL}$ includes the gate electrode member 152, such as polycrystalline silicon (Si), containing the P-type impurities. Similarly to the gate electrode of the transistor $Tr_{NL}$, the gate electrodes of the transistors $Tr_{NL'}$, $Tr_{PL'}$, $Tr_{NH}$, $Tr_{PH}$ contain gate electrode members 142', such as polycrystalline silicon (Si), containing N-type impurities.

FIG. 37 indicates a thickness of the gate insulating films of the transistors $Tr_{NL}$, $Tr_{PL}$ in the Z-direction as $T_L$. FIG. 37 indicates a thickness of the gate insulating films of the transistors $Tr_{NL'}$, $Tr_{PL'}$ in the Z-direction as $T_{L'}$. FIG. 37 indicates a thickness of the gate insulating films of the transistors $Tr_{NH}$, $Tr_{PH}$ in the Z-direction as $T_H$. $T_L$ is smaller than $T_{L'}$. $T_{L'}$ is smaller than $T_H$.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a memory cell array disposed to be separated from the substrate in a first direction intersecting with a surface of the substrate; and
   a plurality of first bonding pad electrodes arranged in a second direction intersecting with the first direction, the plurality of first bonding pad electrodes being disposed at positions away from the memory cell array in a third direction intersecting with the first direction and the second direction, the plurality of first bonding pad electrodes being usable for an input of data to be written to the memory cell array and an output of data read from the memory cell array, wherein
   the substrate includes a plurality of first regions and a plurality of second regions arranged alternately in the second direction,
   the memory cell array includes:
      a plurality of conductive layers that extend in the second direction across the plurality of first regions and the plurality of second regions, the plurality of conductive layers being arranged in the first direction;
      a plurality of semiconductor layers disposed in the plurality of first regions, the plurality of semiconductor layers extending in the first direction and being opposed to the plurality of conductive layers; and
      a plurality of first contacts disposed in the plurality of second regions, the plurality of first contacts extending in the first direction, the plurality of first contacts having one ends in the first direction closer to the substrate than the plurality of conductive layers and other ends in the first direction farther from the substrate than the plurality of conductive layers, wherein
   when a distance in the second direction and the third direction between a center position in the second direction and the third direction of a first bonding pad electrode of one of the plurality of first bonding pad electrodes and a center position in the second direction and the third direction of a first contact of the plurality of first contacts closest to the first bonding pad electrode is defined as a first distance,
   a difference between a largest first distance and a smallest first distance among a plurality of first distances corresponding to the plurality of first bonding pad electrodes is 400 nm or less.

2. The semiconductor memory device according to claim 1, wherein
   when a distance in the second direction and the third direction between the center position in the second direction and the third direction of the first bonding pad electrode of one of the plurality of first bonding pad electrodes and a center position in the second direction and the third direction of the first contact closest to the first bonding pad electrode among the plurality first contacts included in the second region second closest to the first bonding pad electrode is defined as a second distance,
   a difference between a largest second distance and a smallest second distance among a plurality of second distances corresponding to the plurality of first bonding pad electrodes is 400 nm or less.

3. The semiconductor memory device according to claim 1, wherein
   when a center position in the second direction between two second regions of the plurality of second regions adjacent in the second direction is defined as a first position, the plurality of first bonding pad electrodes include respective parts disposed at a plurality of first positions.

4. The semiconductor memory device according to claim 1, wherein
   when a center position in the second direction between two second regions of the plurality of second regions adjacent in the second direction is defined as a first position, center positions in the second direction of the plurality of first bonding pad electrodes are not matched with any of a plurality of first positions.

5. The semiconductor memory device according to claim 1, wherein
   two center positions in the second direction are provided corresponding to two first bonding pad electrodes of the plurality of first bonding pad electrodes between two second regions of the plurality of second regions adjacent in the second direction.

6. The semiconductor memory device according to claim 1, further comprising:
   a plurality of first driving circuits connected to the plurality of first bonding pad electrodes respectively, each of the plurality of first driving circuits including a plurality of transistors connected in parallel between the first bonding pad electrode of the plurality of first bonding pad electrodes and a voltage supply line; and
   a plurality of second driving circuits connected to the plurality of first bonding pad electrodes respectively, each of the plurality of second driving circuits including a comparator connected to the first bonding pad electrode, wherein
   the substrate includes a plurality of third regions disposed at positions away from the plurality of first regions and the plurality of second regions in the third direction, the plurality of third regions being arranged in the second direction, and
   the plurality of third regions each include a plurality of transistors constituting one of the plurality of first driving circuits and a plurality of transistors constituting one of the plurality of second driving circuits.

7. The semiconductor memory device according to claim 6, wherein
   when a distance in the second direction and the third direction between a center position in the second direction and the third direction of a third region of one of the plurality of third regions and a center position in the second direction and the third direction of a first contact of the plurality of first contacts closest to the third region is defined as a third distance, a difference between a largest third distance and a smallest third distance among a plurality of third distances corresponding to the plurality of third regions is 400 nm or less.

8. The semiconductor memory device according to claim 6, wherein when a distance in the second direction and the third direction between a center position in the second direction and the third direction of a third region of one of the plurality of third regions and a center position in the second direction and the third direction of a first contact of the plurality of first contacts closest to the third region included in the second region second closest to the third region is defined as a fourth distance, a difference between a largest fourth distance and a smallest fourth distance among a plurality of fourth distances corresponding to the plurality of third regions is 400 nm or less.

9. The semiconductor memory device according to claim 6, wherein a gate electrode of at least one of a plurality of transistors included in a third region of the plurality of third regions contains boron (B).

* * * * *